(12) United States Patent
Lee

(10) Patent No.: US 7,999,279 B2
(45) Date of Patent: Aug. 16, 2011

(54) GAN COMPOUND SEMICONDUCTOR LIGHT EMITTING ELEMENT AND METHOD OF MANUFACTURING THE SAME

(75) Inventor: Jong-Lam Lee, Pohang (KR)

(73) Assignees: Seoul Opto Device Co., Ltd., Ansan-si (KR); Postech Foundation, Pohang (KR)

( * ) Notice: Subject to any disclaimer, the term of this patent is extended or adjusted under 35 U.S.C. 154(b) by 0 days.

(21) Appl. No.: 12/769,614

(22) Filed: Apr. 28, 2010

(65) Prior Publication Data

US 2010/0213494 A1 Aug. 26, 2010

Related U.S. Application Data

(62) Division of application No. 11/577,710, filed as application No. PCT/KR2005/003527 on Oct. 21, 2005.

(30) Foreign Application Priority Data

| Oct. 22, 2004 | (KR) | 10-2004-0084917 |
| Nov. 29, 2004 | (KR) | 10-2004-0098467 |
| Jun. 25, 2005 | (KR) | 10-2005-0055348 |

(51) Int. Cl.
*H01L 33/46* (2010.01)

(52) U.S. Cl. ..... 257/98; 257/99; 257/100; 257/E33.067; 438/22; 438/29

(58) Field of Classification Search ............ 257/94–100, 257/E23.067; 438/22, 26, 29
See application file for complete search history.

(56) References Cited

U.S. PATENT DOCUMENTS 5,585,648 A 12/1996 Tischler
(Continued)

FOREIGN PATENT DOCUMENTS

JP 6-350132 12/1994
(Continued)

OTHER PUBLICATIONS

Notice of Allowance issued on Feb. 25, 2011 in co-pending U.S. Appl. No. 11/577,710.

(Continued)

*Primary Examiner* — Thinh Nguyen
(74) *Attorney, Agent, or Firm* — H.C. Park & Associates, PLC

(57) ABSTRACT

The present invention relates to a gallium nitride (GaN) compound semiconductor light emitting element (LED) and a method of manufacturing the same. The present invention provides a vertical GaN LED capable of improving the characteristics of a horizontal LED by means of a metallic protective film layer and a metallic support layer. According to the present invention, a thick metallic protective film layer with a thickness of at least 10 microns is formed on the lateral and/or bottom sides of the vertical GaN LED to protect the element against external impact and to easily separate the chip. Further, a metallic substrate is used instead of a sapphire substrate to efficiently release the generated heat to the outside when the element is operated, so that the LED can be suitable for a high-power application and an element having improved optical output characteristics can also be manufactured. A metallic support layer is formed to protect the element from being distorted or damaged due to impact. Furthermore, a P-type electrode is partially formed on a P-GaN layer in a mesh form to thereby maximize the emission of photons generated in the active layer toward the N-GaN layer.

7 Claims, 34 Drawing Sheets

U.S. PATENT DOCUMENTS

| | | |
|---|---|---|
| 6,740,906 B2 | 5/2004 | Slater, Jr. et al. |
| 6,744,071 B2 | 6/2004 | Sano |
| 6,794,690 B2 | 9/2004 | Uemura |
| 2003/0141506 A1 | 7/2003 | Sano et al. |
| 2003/0189212 A1 | 10/2003 | Yoo |
| 2004/0207320 A1 | 10/2004 | Erchak |
| 2004/0235210 A1* | 11/2004 | Tamura et al. .................. 438/22 |

FOREIGN PATENT DOCUMENTS

| | | |
|---|---|---|
| JP | 11340514 | 12/1999 |
| JP | 2003-046139 | 2/2003 |
| JP | 2004-095959 | 3/2004 |
| JP | 2004-119981 | 4/2004 |
| JP | 2004-179491 | 6/2004 |
| JP | 2004-281863 | 10/2004 |
| JP | 2005-084634 | 3/2005 |
| WO | 03-065464 | 8/2003 |

OTHER PUBLICATIONS

Jeffrey S. Velson "Research and Manufacturing Synergies Between LEDs and PV" in NCPV and Solar Program Review Meeting Proceedings 2003, p. 319-338 see Latest Nichai Structure, State-of-Art in AlInGaN Chops in p. 330.

Non-Final Office Action dated Jun. 24, 2010 in U.S. Appl. No. 11/577,710.

Final Office Action dated Nov. 29, 2010, issued in co-pending U.S. Appl. No. 11/577,710.

Jeffrey S. Nelson "Research and Manufacturing Synergies Between LEDs and PV" in NCPV and Solar Program Review Meeting Proceedings, Mar. 24-26 2003; p. 319-338 (see State-of-the-Art in AlInGaN Chips, p. 330).

Notice of Allowance of U.S. Appl. No. 12/695,596 issued on May 24, 2011.

Notice of Allowance of U.S. Appl. No. 13/073,783 issued on Jun. 27, 2011.

* cited by examiner

GAN COMPOUND SEMICONDUCTOR LIGHT EMITTING ELEMENT AND METHOD OF MANUFACTURING THE SAME

CROSS REFERENCE TO RELATED APPLICATIONS

This application is a divisional of U.S. patent application Ser. No. 11/577,710, filed Apr. 20, 2007, which is the National Stage Entry of International Application No. PCT/KR2005/003527, filed Oct. 21, 2005, and claims priority from Korean Patent Application No. 2005-0055348, filed Jun. 25, 2005; Korean Patent Application No. 2004-0098467, filed Nov. 29, 2004; and Korean Patent Application No. 2004-0084917, filed Oct. 22, 2004, which are hereby incorporated by reference for all purposes as if fully set forth herein.

TECHNICAL FIELD

The present invention relates to a gallium nitride (GaN) based blue light emitting diode (LED) and a method of manufacturing the same. More particularly, the present invention relates to a vertical GaN LED element and a method of manufacturing the same.

BACKGROUND ART

Recently, the LED using a GaN semiconductor has been predominantly expected to replace existing light sources such as incandescent lamps, fluorescent lamps and mercury lamps. Thus, researches on a high-power GaN LED have been intensively made. In general, a substrate used for manufacturing a GaN LED is configured in such a manner that an n-type GaN 12, undoped InGaN (an active layer; 14) and a p-type GaN 16 are sequentially grown on a sapphire substrate 10, as shown in FIG. 1. Since the sapphire substrate 10 is non-conductive, the LED element typically has a horizontal structure as shown in FIG. 2. Here, reference numerals 18, 20, 22 and 24 denote a P-type transparent electrode, a P-type pad, an N-type electrode and an N-type pad, respectively.

In such a case, when it is in a high-power operation, the current spreading-resistance is high, and thus, its optical output is degraded. In addition, heat generated when the element is operated cannot be smoothly removed and thus thermal stability of the element is degraded to thereby cause a problem related with the high-power operation. In order to overcome this problem and implement a high-power GaN LED, a flip-chip LED using a flip-chip packaging method has been proposed and currently used. In the case of a flip-chip LED shown in FIG. 3, light emitted from the active layer 14 is emitted through the sapphire substrate 10. Therefore, since a thick p-type ohmic electrode 19 can be used instead of a transparent electrode 18, its current spreading-resistance can be reduced. Here, reference numerals 25, 30 and 32 denotes a solder, a heat sink and a conducting mount, respectively. However, since the flip-chip structure must be packed in the form of a flip-chip, the manufacturing process is complicated. In addition, since a large amount of light emitted from the active layer 14 is absorbed in the sapphire while the light is being emitted through the sapphire substrate 10, its optical efficiency is also degraded.

DISCLOSURE OF INVENTION

Technical Problem

Therefore, the present invention is conceived to solve the above problems. An object of the present invention is to provide a gallium nitride (GaN) compound semi-conductor light emitting element (LED) and a method of manufacturing the same, in which a multi-layered metallic support is formed underside a vertical GaN LED to thereby enable an easy chip separation, and an insulation film and metallic protective film layer are sequentially formed on a lateral surface of the element to thereby enable the protection of an epitaxially grown GaN substrate.

Another object of the present invention is to provide a GaN compound semi-conductor LED and a method of manufacturing the same, in which a p-type reflective film electrode is partially formed on a p-GaN in a mesh form and a reflective layer is inserted therebetween such that photons formed in an active layer can be maximally emitted toward an n-GaN layer.

A further object of the present invention is to provide a GaN compound semi-conductor LED and a method of manufacturing the same, in which a metallic substrate, conductive layer substrate or conductive ceramic substrate is used, instead of a sapphire substrate, to efficiently release heat generated upon the operation of the element to the outside, so that the LED can be suitable for a high-power application.

A still further object of the present invention is to provide a GaN compound semi-conductor LED and a method of manufacturing the same, in which photons generated in an InGaN layer are emitted through an n-GaN layer to provide a short path to the photons, so that the number of photons absorbed while being emitted can be reduced.

A still further object of the present invention is to provide a GaN compound semi-conductor LED and a method of manufacturing the same, in which high concentration of doping ($>10^{19}/cm^3$) into an n-GaN layer can be obtained to thereby improve electrical conductivity of n-GaN layer and enable to enhance optical output characteristics thereof.

Technical Solution

According to an aspect of the present invention for achieving the objects, there is provided a light emitting element, comprising a metallic support layer; a P-type reflective film electrode on the metallic support layer; a P-type semiconductor layer, an active layer and an N-type semiconductor layer sequentially formed on the P-type reflective film electrode; and an N-type electrode formed on the N-type semiconductor layer.

According to another aspect of the present invention, there is provided a light emitting element, comprising a metallic support layer; a reflective layer formed on the metallic support layer; a P-type reflective film electrode formed in the form of a mesh on the reflective layer; a P-type semiconductor layer, an active layer and an N-type semiconductor layer sequentially formed on the top of the reflective layer including the P-type reflective film electrode; and an N-type electrode formed at a desired region on the N-type semiconductor layer.

The light emitting element may further comprise an insulation film formed at least on a lateral side of the N-type semiconductor layer, and a metallic protective layer for protecting the P-type and N-type semiconductor layers.

Preferably, the metallic support layer has a multi-layered support structure.

The light emitting element may further comprise a protective layer formed on a part of lateral and/or bottom sides of the N-type semiconductor layer, active layer and P-type semiconductor layer. The light emitting element may further comprise an anti-reflective layer that wraps around the P-type semiconductor layer, active layer and N-type semiconductor layer.

Preferably, the P-type reflective film electrode comprises a contact metallic layer, a reflective metallic layer, a diffusion barrier layer and a bonding metallic layer. At this time, the contact metallic layer is formed of at least one of Ni, Ir, Pt, Pd, Au, Ti, Ru, W, Ta, V, Co, Os, Re and Rh. The reflective metallic layer is formed of Al or Ag. The diffusion barrier layer is formed of at least one of Ru, Ir, Re, Rh, Os, V, Ta, W, ITO (Indium Tin Oxide), IZO (Indium Zinc Oxide), $RuO_2$, $VO_2$, MgO, $IrO_2$, $ReO_2$, $RhO_2$, $OsO_2$, $Ta_2O_3$ and $WO_2$. The bonding metallic layer is composed of first and second bonding metallic layers. The first bonding metallic layer is formed of at least one of Ni, Cr, Ti, Pd, Ru, Ir, Rh, Re, Os, V and Ta. The second bonding metallic layer is formed of at least one of Au, Pd and Pt.

According to a further aspect of the present invention, there is provided a light emitting element, comprising a P-type semiconductor layer; an active layer and an N-type semiconductor layer formed on the P-type semiconductor layer; an N-type electrode formed on the N-type semiconductor layer; an insulation film formed on at least a lateral side of the N-type semiconductor layer; and a metallic protective layer for protecting the P-type semiconductor layer and N-type semiconductor layer.

Preferably, the metallic protective layer is formed on lateral sides of the P-type and N-type semiconductor layers and on a bottom side of the P-type semiconductor layer.

In addition, the light emitting element may further comprise an insulation layer formed on a part of a bottom side of the P-type semiconductor layer. Preferably, the insulation layer extends to a lateral side of the active layer.

The light emitting element may further comprise an anti-reflective layer formed on the N-type semiconductor layer.

Of course, the light emitting element may further comprise a P-type electrode formed beneath the P-type semiconductor layer. Preferably, the P-type electrode includes a contact metallic layer, a reflective metallic layer, a diffusion barrier layer and a bonding metallic layer. At this time, the contact metallic layer is formed of at least one of Ni, Ir, Pt, Pd, Au, Ti, Ru, W, Ta, V, Co, Os, Re and Rh. The reflective metallic layer is formed of Al or Ag. The diffusion barrier layer is formed of at least one of Ru, Ir, Re, Rh, Os, V, Ta, W, ITO (Indium Tin Oxide), IZO (Indium Zinc Oxide), $RuO_2$, $VO_2$, MgO, $IrO_2$, $ReO_2$, $RhO_2$, $OsO_2$, $Ta_2O_3$ and $WO_2$. The bonding metallic layer is composed of first and second bonding metallic layers. The first bonding metallic layer is formed of at least one of Ni, Cr, Ti, Pd, Ru, Ir, Rh, Re, Os, V and Ta. The second bonding metallic layer is formed of at least one of Au, Pd and Pt.

According to a still further aspect of the present invention for achieving the objects, there is provided a method of manufacturing a light emitting element, comprising the steps of sequentially forming an N-type semiconductor layer, an active layer and a P-type semiconductor layer on a substrate; isolating the element by partially etching the P-type semiconductor layer, the active layer, the N-type semiconductor layer and the substrate; forming a P-type reflective film electrode on the isolated P-type semi-conductor layer and forming a first metallic support layer on the whole structure; removing the substrate; and forming an N-type electrode on the N-type semiconductor layer.

According to a still further aspect of the present invention, there is provided a method of manufacturing a light emitting element, comprising the steps of sequentially forming an N-type semiconductor layer, an active layer, a P-type semiconductor layer, a P-type reflective film electrode and a first metallic support layer on a substrate; removing the substrate; isolating the element by partially etching the P-type semiconductor layer, the active layer and the N-type semiconductor layer; and forming an N-type electrode on the N-type semiconductor layer.

Preferably, an isolated second metallic support layer is formed on the first metallic support layer, and the first and second metallic support layers are formed through an electroplating method or using a vacuum vapor-deposition apparatus such as a thermal evaporator, an e-beam evaporator, a laser evaporator, a sputter and an MOCVD apparatus.

More preferably, the first and second metallic support layers are formed of at least one of Au, Ni, W, Mo, Cu, Al, Ta, Ag, Pt and Cr, or using a conductive ceramic substrate such as $SrTiO_3$ doped with Nb, ZnO doped with Al, ITO (Indium Tin Oxide) or IZO (Indium Zinc Oxide) or a semiconductor substrate such as B-doped Si, As-doped Si and diamond doped with impurities, and a total thickness of the first and second metallic support layers is 0.5 to 200 nm.

The method of manufacturing a light emitting element may further comprise the step of, after the step of isolating the element, forming a protective layer for protecting the isolated P-type semiconductor layer, active layer and N-type semiconductor layer. In addition, the method of manufacturing a light emitting element may further comprise the step of, after the step of isolating the element, forming an anti-reflective layer wrapping around the isolated P-type semiconductor layer, active layer and N-type semiconductor layer.

Preferably, a portion of the anti-reflective layer formed on the N-type semi-conductor layer is removed and the N-type electrode is then formed on the removed portion of the anti-reflective layer.

According to a still further aspect of the present invention, there is provided a method of manufacturing a vertical semiconductor light emitting element, comprising the steps of sequentially forming an N-type semiconductor layer, an active layer and a P-type semiconductor layer on a substrate; forming an insulation film on a lateral side of the N-type semiconductor layer except a portion of the P-type semiconductor layer; forming a P-type electrode on the portion of the P-type semiconductor layer on which the insulation film is not formed; forming a metallic support film layer in such a way to wrap around the P-type and N-type semiconductor layers; removing the substrate; and forming an N-type electrode on the N-type semiconductor layer.

Here, the method of manufacturing a vertical semiconductor light emitting element may further comprise the step of, after the step of forming the P-type electrode, forming a reflective layer on the P-type semiconductor layer on which the P-type electrode is formed.

The method of manufacturing a vertical semiconductor light emitting element may further comprise the steps of, after the step of forming a reflective layer on the P-type semiconductor layer, removing the reflective layer on a region on which the P-type electrode will be formed and forming the P-type electrode on the region from which the reflective layer is removed.

The method of manufacturing a vertical semiconductor light emitting element may further comprise the step of, after the step of forming the metallic protective film layer, forming a metallic support layer on the P-type semiconductor layer on which the metallic protective film layer is formed.

The method of manufacturing a vertical semiconductor light emitting element may further comprise the steps of, after the step of removing the substrate, forming an anti-reflective layer on the N-type semiconductor layer and exposing a portion of the N-type semiconductor layer by removing a portion of the anti-reflective layer.

Preferably, the step of forming the insulation film on a lateral side of the N-type semiconductor layer except a portion of the P-type semiconductor layer comprises the steps of forming the insulation film in such a way to wrap around the P-type and N-type semiconductor layers and removing the portion of the insulation film from the P-type semiconductor layer.

BEST MODE FOR CARRYING OUT THE INVENTION

Figure 1:
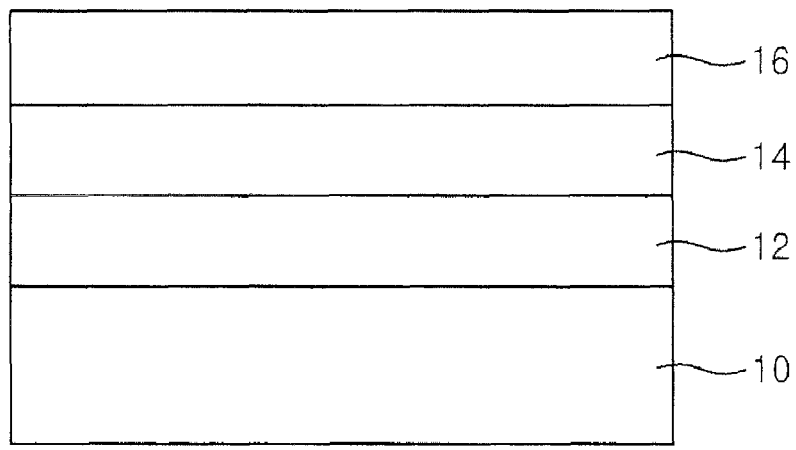
FIG. 1 shows a thin film structure of a conventional GaN-based blue LED substrate.

Hereinafter, embodiments of the present invention will be described in detail with reference to the accompanying drawings. However, the present invention is not limited to the embodiments set forth herein, but will be implemented in many different forms. Rather, the embodiments of the present invention are provided such that the disclosure will be completed and will fully convey the scope of the invention to those skilled in the art. In the drawings, like reference numerals denote like elements.

Figure 4:
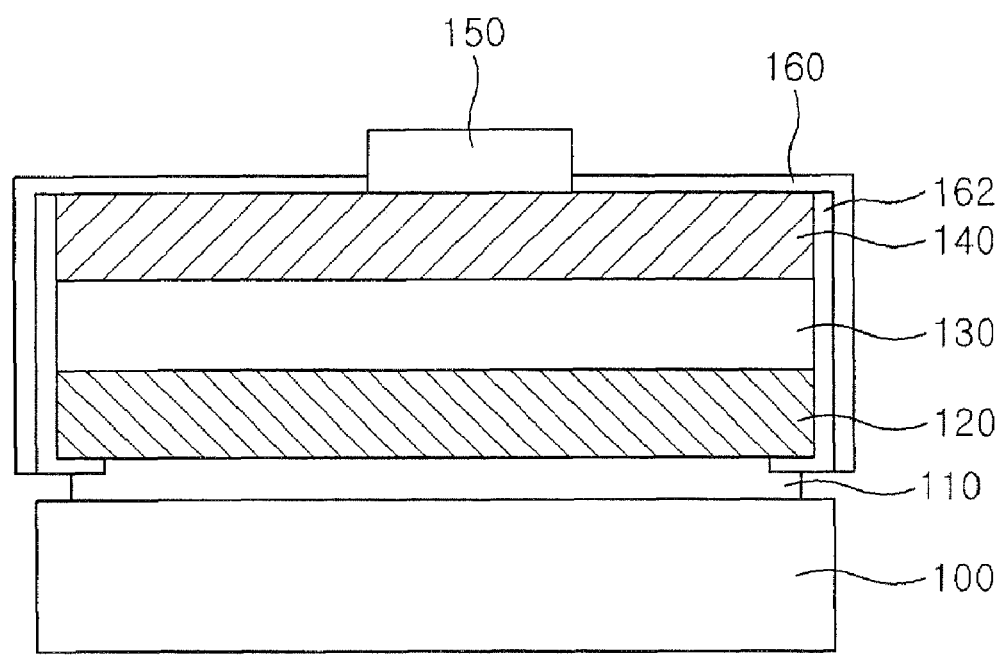
FIGS. 4 to 7 are sectional views of a vertical LED according to a first embodiment of the present invention.
Figure 5:
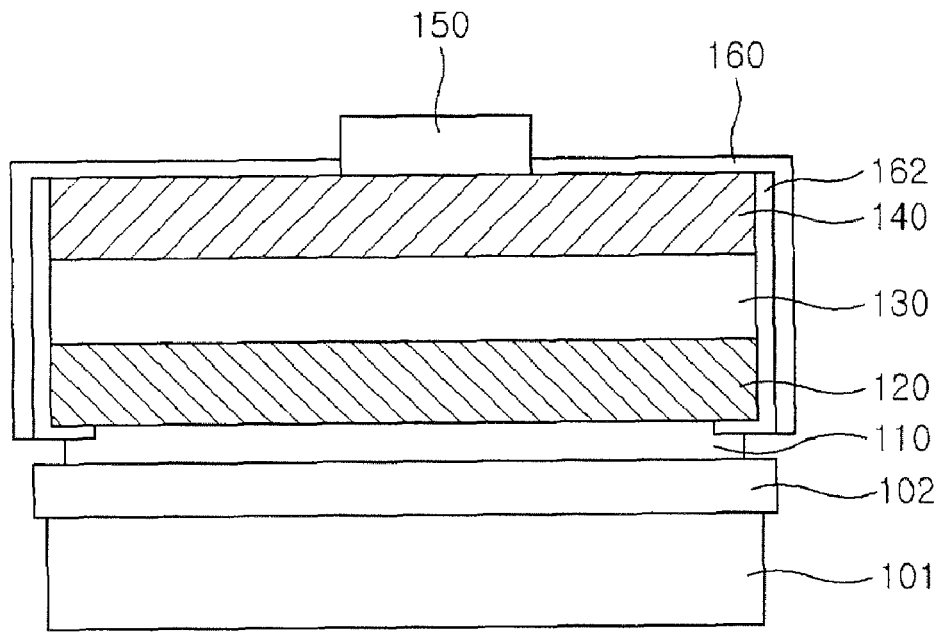
Figure 6:
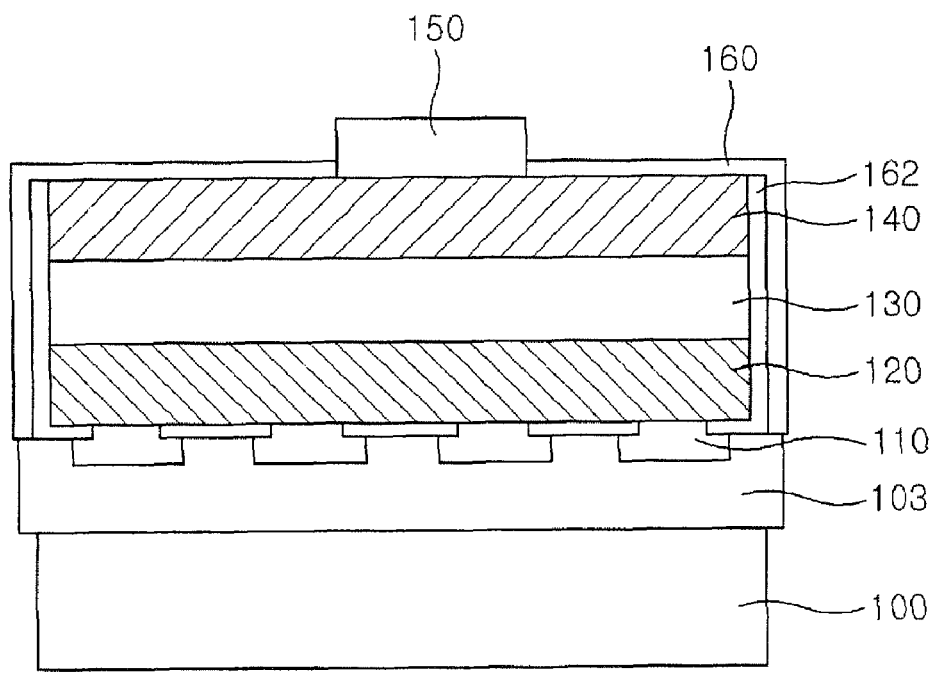
Figure 7:
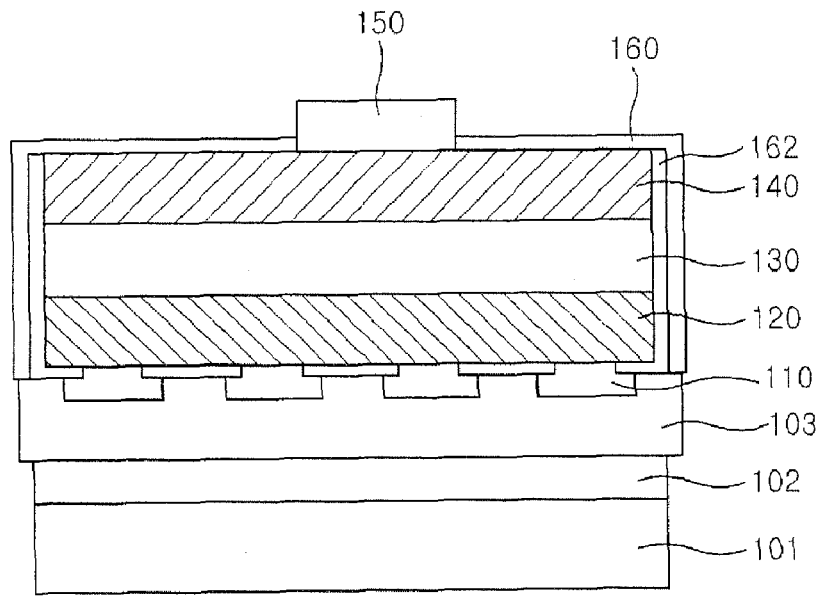

FIG. 4 is a sectional view of a vertical LED according to a first embodiment of the present invention, and FIGS. 5 to 7 are sectional views of a vertical LED according to a modified embodiment of the present invention.

As shown in FIG. 4, the vertical GaN LED of this embodiment includes a metallic support layer 100, a reflective film electrode 110 (a p-type reflective film ohmic electrode layer), a p-type semiconductor layer 120, an InGaN active layer 130 and an n-type semiconductor layer 140 in sequence from the bottom.

Referring to FIG. 5, a vertical GaN LED according to a modified embodiment of the present invention employs a double-layered metallic support composed of first and second metallic support layer 101 and 102 to enable easy chip separation. In a vertical GaN LED shown in FIG. 6, a p-type reflective film electrode 110 is partially formed on a p-type semiconductor in a mesh form and a reflective layer 103 is then inserted therebetween, so that light generated in the i-InGaN (the active layer 130) can be maximally emitted toward the n-type semiconductor layer 140. Comparing with the vertical GaN LED shown in FIG. 6, a vertical GaN LED shown in FIG. 7 employs a double-layered metallic support 101 and 102, thereby enabling the easy chip separation. Here, reference numerals 150, 160 and 162 denote an n-type ohmic electrode, an anti-reflective layer and a protective layer, respectively.

Hereinafter, a method of manufacturing the vertical LED element so configured will be explained with reference to the accompanying drawings.

FIGS. 8 to 15 are a series of sectional views illustrating a process of manufacturing a vertical LED element according to the first embodiment of the present invention.

Figure 8:
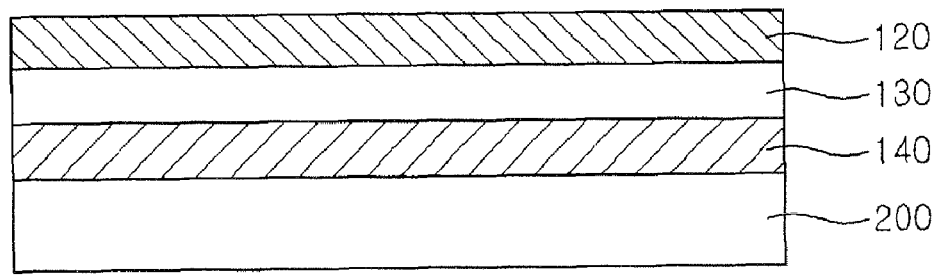
FIGS. 8 to 15 show a process of manufacturing the vertical LED element according to the first embodiment of the present invention.

FIG. 8 is a sectional view of a common GaN LED substrate. An n-type semi-conductor layer 140, an InGaN active layer 130 and a p-type semiconductor layer 120 are grown sequentially on a sapphire substrate 200. The total thickness of the thin film is approximately 4 microns, and the thin film is deposited through a metal-organic chemical vapor deposition (MOCVD).

Figure 9:
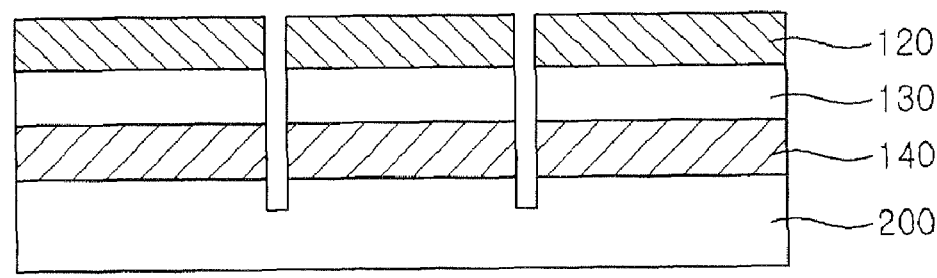
Figure 10:
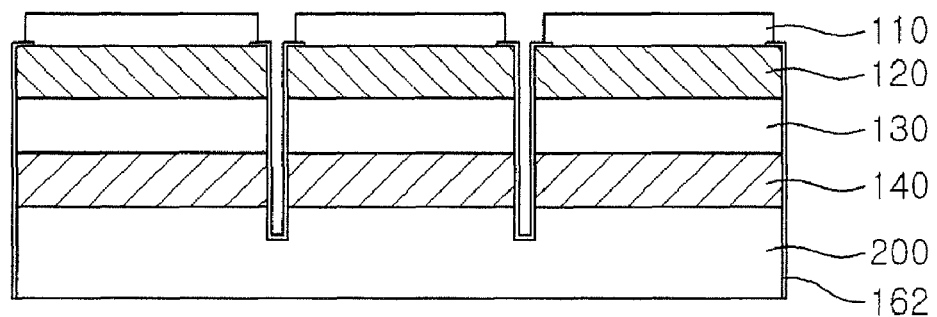

FIG. 9 shows a process of etching an area other than the element region. The etching process is performed through a dry-etching method in a state where $Cl_2$ gas flows after a substrate has been masked using photoresist or $SiO_2$. FIG. 10 shows a process of forming a p-type reflective film ohmic electrode 110. On the substrate etched for the element isolation is formed a $SiO_2$ protective layer 162 with a thickness of 0.05~5.0 microns through a plasma-enhanced chemical vapor deposition (PECVD). In order to form a reflective film ohmic electrode 110, a micro pattern is formed and an etching is then performed using buffered oxide etchant (BOE) or $CF_4$ gas through a dry-etching method and using a photoresist as a mask. Thereafter, a metallic ohmic layer is deposited. Typically, Ni and Au are deposited with a thickness of several tens to several hundreds of nanometers using an e-beam evaporator. However, since reflectivity is important in case of a vertical LED shown in FIGS. 4 to 7, metals including Ni/Ag, Pt/Ag, Ru/Ag, Ir/Ag or the like are used. Then, heat treatment is performed within a temperature range of 300 to 600° C. to form the reflective film ohmic electrode 110.

Figure 11:
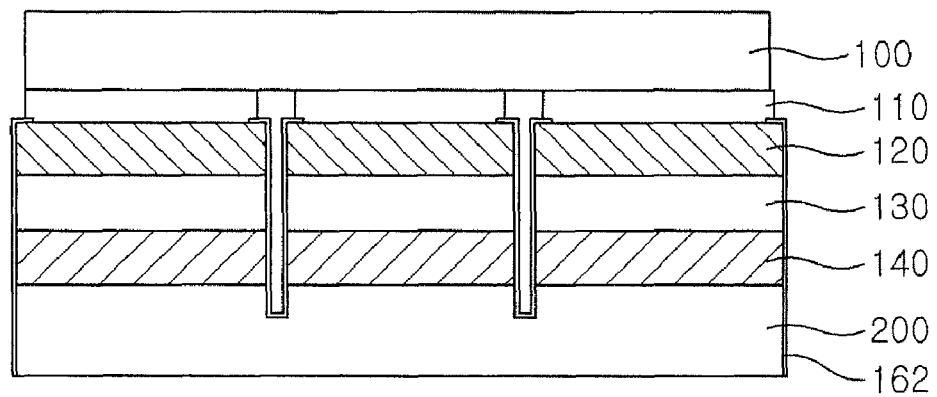

FIG. 11 shows a process of forming a metallic support layer 100 with a thickness of several microns to several tens of microns and radiating a laser. The metallic support layer 100 is formed through an electro-plating method, a vacuum vapor-deposition method such as sputtering, e-beam evaporation or thermal evaporation, or a wafer diffusion bonding method in which a metallic substrate is placed on a p-type electrode and they are pressed under a certain pressure at around 300° C. such that they are bonded to each other. When a laser is radiated through sapphire, the laser is absorbed in the GaN layer which in turn is decomposed into a Ga metal and $N_2$ gas. At this time, the metallic support layer 100 serves to prevent the GaN thin film layer with a thickness of about 4 microns from being destroyed when the sapphire substrate 200 is removed by means of the laser radiation.

Figure 12:
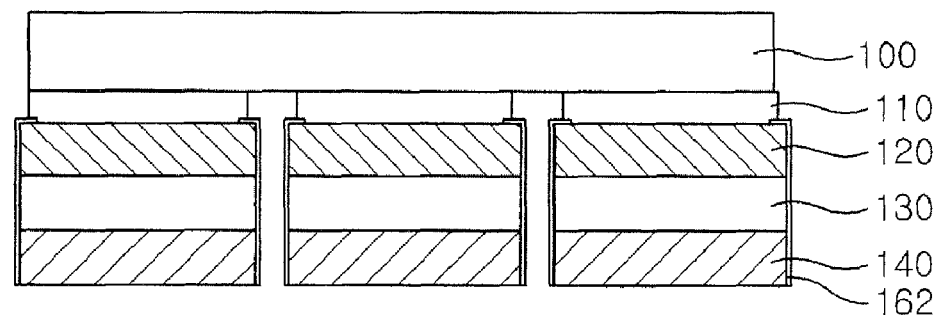
Figure 13:
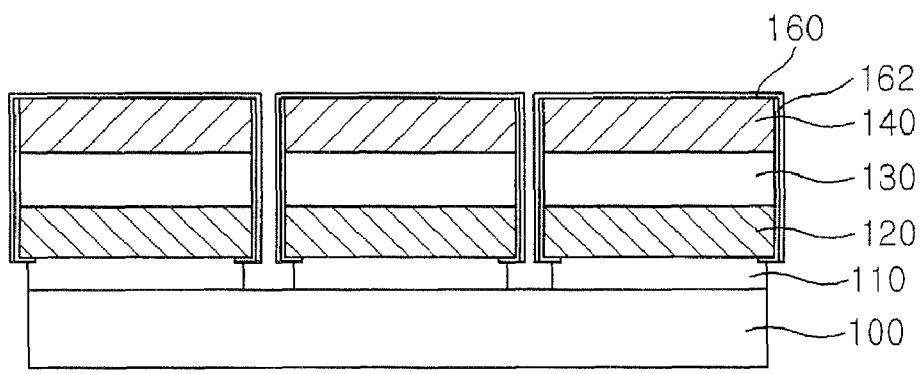

FIG. 12 shows a state where a GaN thin film layer is attached to the metallic support layer 100 after the sapphire substrate 200 has been removed. FIG. 13 is a sectional view showing a state where an anti-reflective layer 160 is coated on the n-type semi-conductor layer 140 such that photons generated in the i-InGaN active layer 130 can be smoothly emitted to the outside of the substrate. The anti-reflective layer 160 is formed of $SiO_2$ or $Si_3N_4$ which is deposited through the PECVD method.

Figure 14:
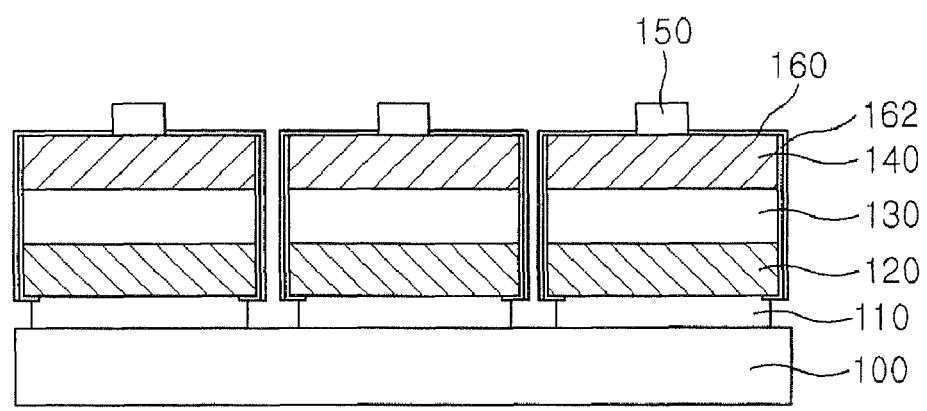
Figure 15:
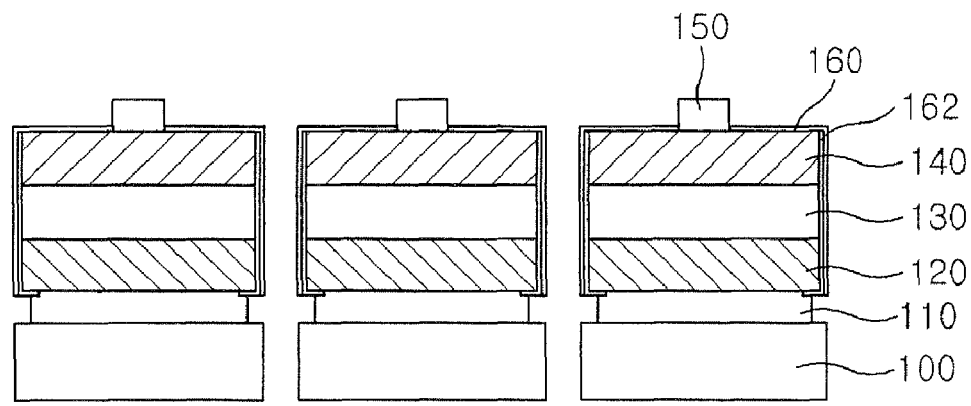

FIG. 14 is a sectional view illustrating a state after portions of the anti-reflective layer 160 have been etched and an n-type ohmic electrode 150 is then formed on the etched portions. The N-type ohmic electrode is formed of Ti/Al or Cr/Au, or Ti/Al or Cr/Au on which Cr/Au or Ni/Au is deposited using an e-beam evaporator. FIG. 15 is a sectional view showing a state after the chip has been separated. The chip is separated through a dicing or laser-cutting technique.

FIGS. 16 to 45 show a series of processes of manufacturing a vertical LED element according to a modified embodiment of the present invention.

Figure 16:
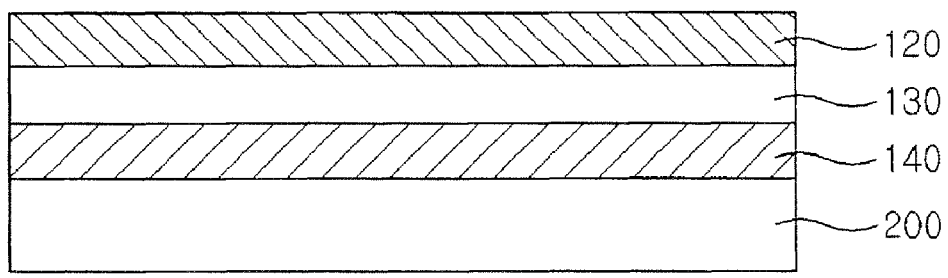
FIGS. 16 to 45 show a process of manufacturing a vertical LED element according to modified embodiments of the present invention.
Figure 17:
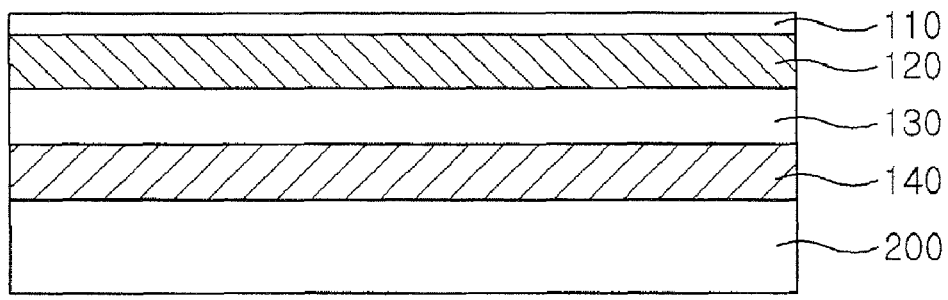
Figure 18:
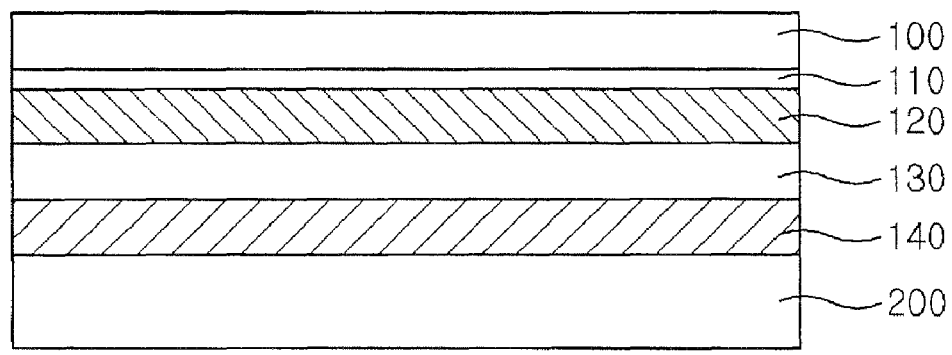
Figure 19:
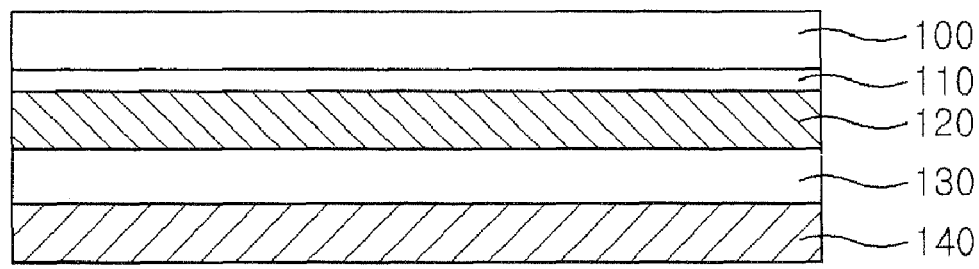
Figure 20:
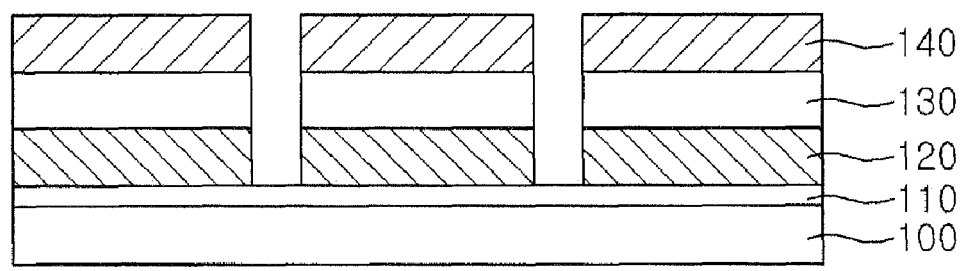

Referring to FIG. 16, a sapphire substrate 200 on which desired GaN layers are formed is first prepared in a similar manner to FIG. 8. Next, before performing a trench etching process, a p-type reflective film ohmic electrode 110 and a metallic support layer 100 are formed (FIGS. 17 and 18) and a laser is then radiated to remove the sapphire substrate 200 (FIG. 19). The substrate (n-GaN, I-InGaN, p-GaN) is etched to isolate the elements from each other (FIG. 20). After coating an anti-reflective layer 160 (FIG. 21), an n-type electrode 150 is formed (FIG. 22) and the chip is separated (FIG. 23) to complete a vertical LED structure.

Figure 24:
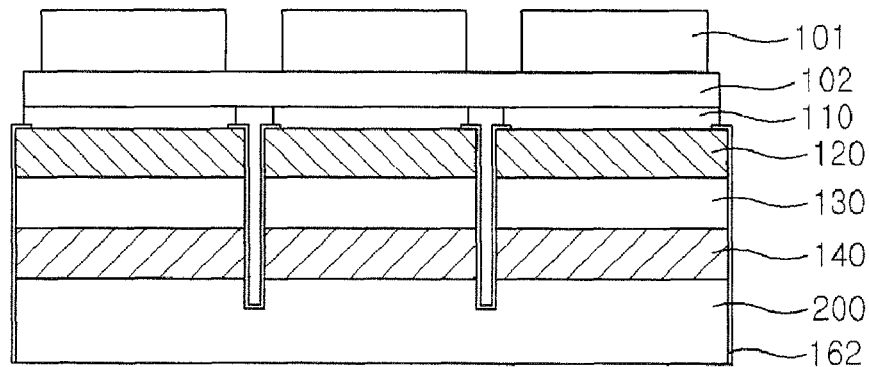
Figure 25:
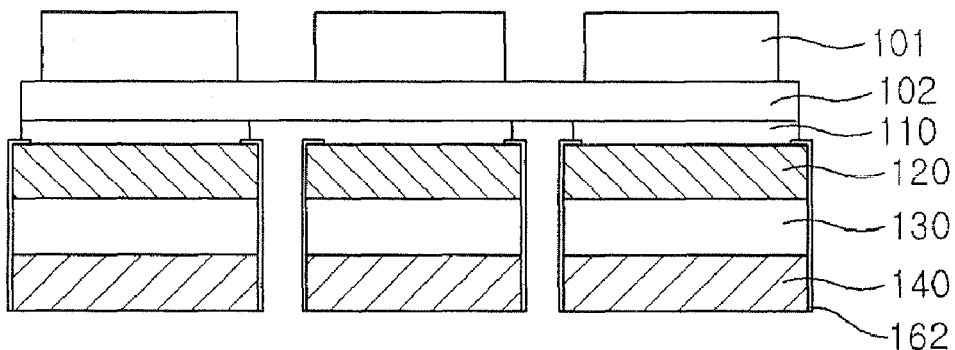
Figure 26:
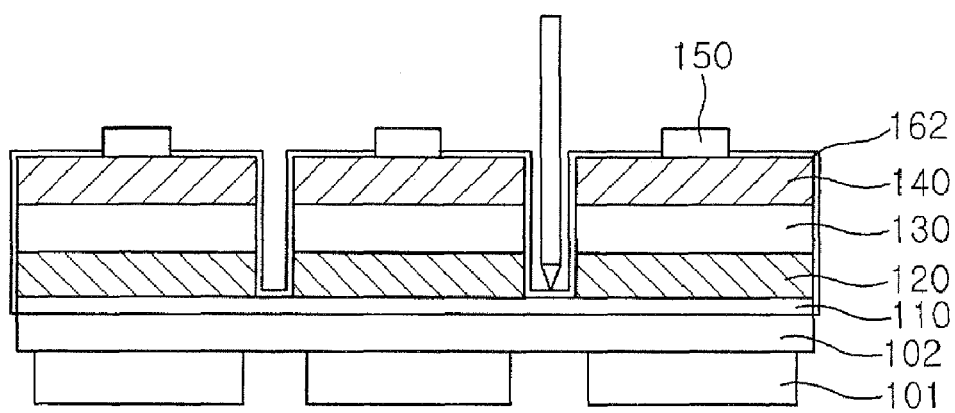

Next, a process of manufacturing a vertical LED element of the modified embodiment will be explained with reference to FIGS. 24 to 26. Here, FIGS. 24 to 26 show processing steps of manufacturing the vertical LED shown in FIG. 7. A substrate that has been explained in conjunction with FIGS. 8 to 11 is first prepared. That is, a substrate with a first metallic support layer 102 formed thereon is prepared. A pattern is formed on an area corresponding to the chip using a photoresist film and a second metallic support layer 101 is then formed using the photoresist as a mask (FIG. 24). A laser is radiated to remove the sapphire substrate 200 (FIG. 25). That is, a step of FIG. 12 and its subsequent process are performed to obtain the vertical LED having the configuration shown in FIG. 5.

More specifically, FIG. 25 shows a step of radiating a laser to remove the substrate as shown in FIG. 11 and forming a pattern on an area corresponding to the chip using a photoresist as shown in FIG. 12 and then forming a second metallic support layer 101 using the photoresist as a mask. Subsequently, a laser is radiated for removing the sapphire substrate 200. The subsequent processes are the same as those subsequent to FIG. 12. Since a double-layered metallic support is employed, a breaking process can be easily performed as shown in FIG. 26. Thus, there is an advantage in that the chip can be easily separated. Consequently, a vertical LED having the structure shown in FIG. 5 can be obtained.

Next, a process of manufacturing a vertical LED element of this modified embodiment will be explained with reference to FIGS. 27 to 29. Here, FIGS. 27 to 29 are a sectional views illustrating processing steps of manufacturing a vertical LED shown in FIG. 5.

Figure 27:
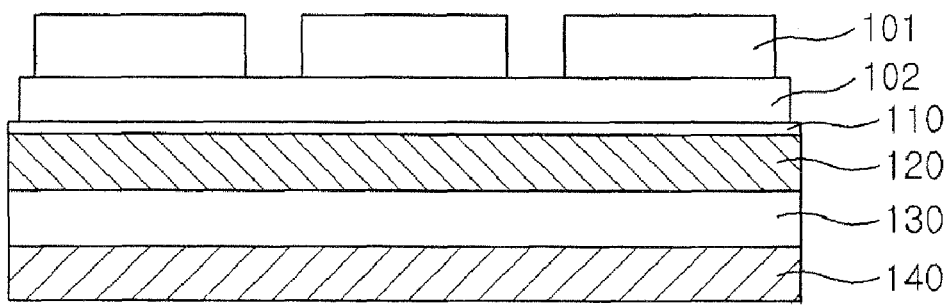

FIG. 27 is a sectional view showing a state after the processes of FIGS. 16 to 19 are performed, a second metallic support layer 101 is further formed, and the sapphire substrate is then removed using a laser. More specifically, the vertical LED having the structure shown in FIG. 5 is obtained by performing the process of FIG. 19 and its subsequent processes.

Figure 28:
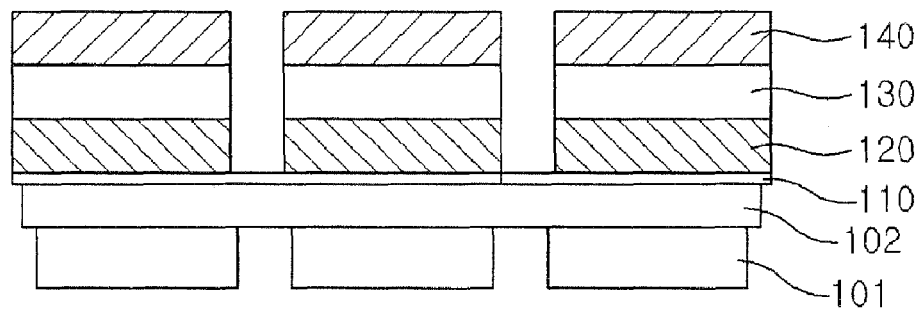
Figure 29:
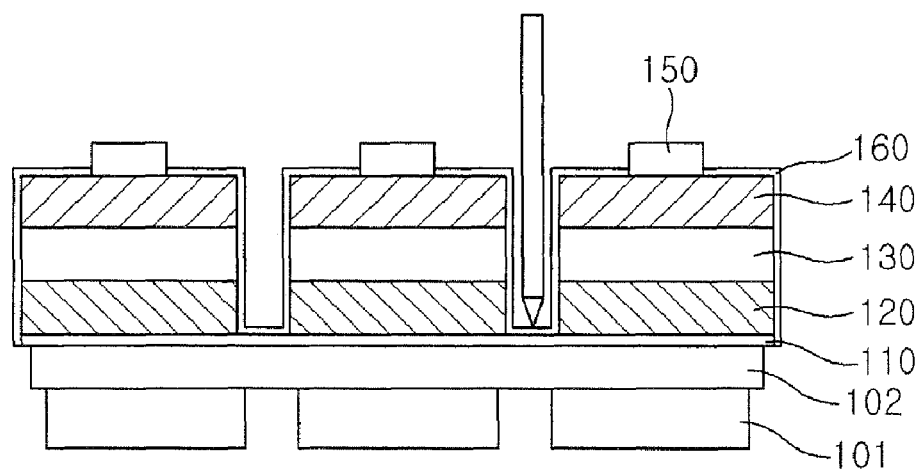

FIG. 28 is a sectional view showing a state the substrate is then etched for the element isolation as shown in FIG. 20. The subsequent processes are the same as those after FIG. 21. Since a double-layered metallic support is employed, a breaking process can be easily performed as shown in FIG. 29. Thus, there is an advantage in that the chip can be easily separated. Consequently, a vertical LED having the structure shown in FIG. 5 can be obtained.

Next, a process of manufacturing a vertical LED element of this modified embodiment will be explained with reference to FIGS. 30 to 33. Here, FIGS. 30 to 33 are sectional views illustrating processing steps of manufacturing a vertical LED of FIG. 6.

Figure 30:
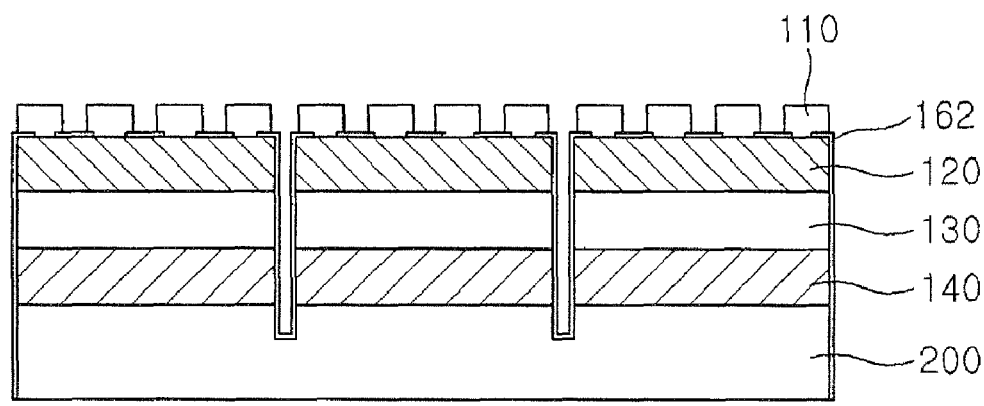

As shown in FIG. 30, after the processes up to FIG. 9 have been finished, a $SiO_2$ protective film 162 with a thickness of 0.05~5.0 microns is vapor-deposited over the whole surface using a PECVD method. Then, a micro-pattern is formed in a mesh form. Using a photoresist as a mask, the $SiO_2$ protective film 162 is dry-etched using the BOE or $CF_4$ gas. A p-type ohmic metal is deposited on portions with the $SiO_2$ removed therefrom, and a p-type reflective film ohmic electrode 110 is then formed through the heat treatment.

Here, Ni and Au may be deposited with a thickness of several tens to several hundreds of nanometers using an e-beam evaporator. However, since reflectivity is important in case of a vertical LED shown in FIGS. 4 to 7, metals including Ni/Ag, Pt/Ag, Ru/Ag, Ir/Ag or the like are used. Then, the rapid thermal annealing is performed for several seconds to several minutes at a temperature of 300 to 600° C. to form the electrode.

Figure 31:
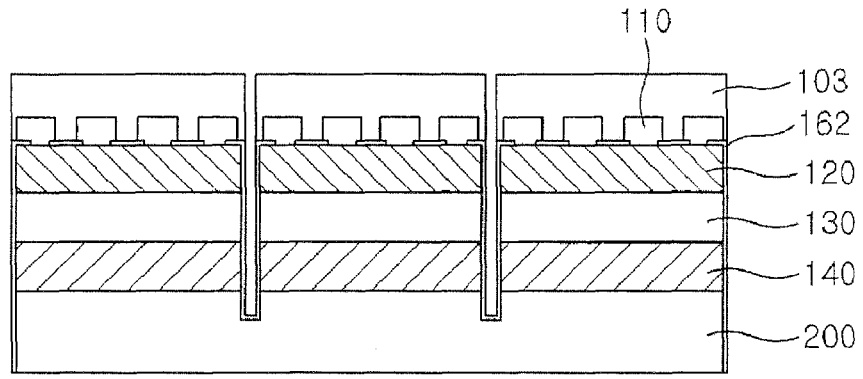
Figure 32:
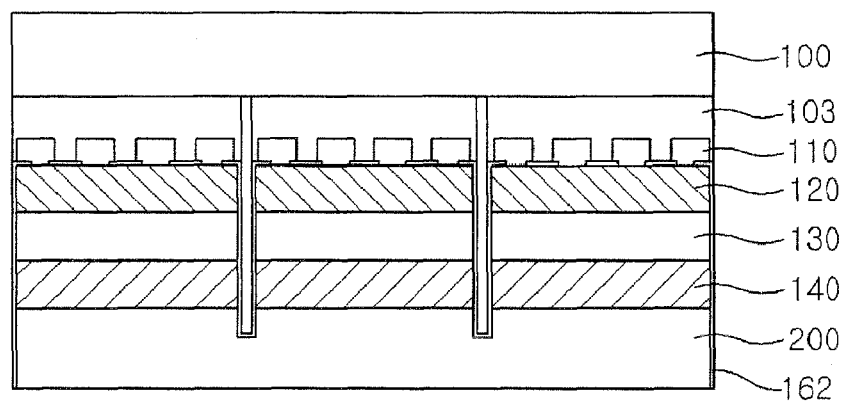
Figure 33:
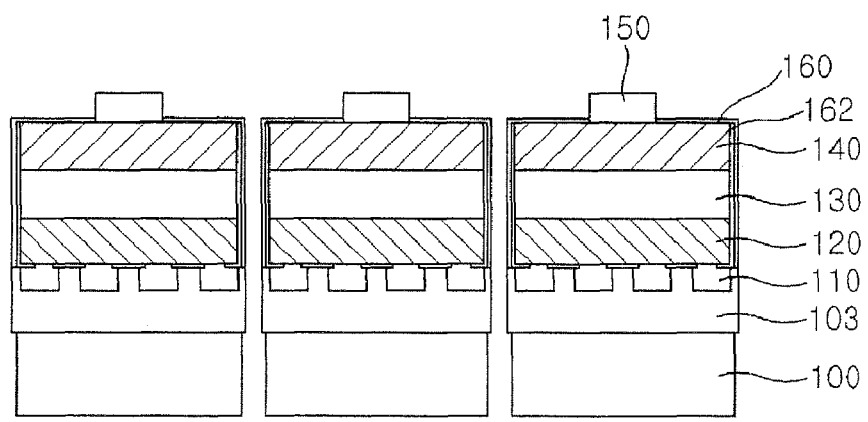

Thereafter, as shown in FIG. 31, Ag or Al-based reflective film 103 is deposited on the p-type reflective ohmic electrode in the form of a mesh. FIG. 32 shows a process of forming a metallic support layer 100 with a thickness of several microns to several tens of microns and radiating a laser. The metallic support layer 100 is formed through an electroplating method, a vacuum vapor-deposition method such as sputtering, e-beam evaporation or thermal evaporation, or a wafer diffusion bonding method in which a metallic substrate is placed on a p-type electrode and they are pressed under a certain pressure at around 300° C. such that they are bonded to each other. When a laser is radiated through sapphire, the laser is absorbed in the GaN layer which in turn is decomposed into a Ga metal and $N_2$ gas. At this time, the metallic support layer 100 serves to prevent the GaN thin film layer with a thickness of about 4 microns from being destroyed when the sapphire substrate 200 is removed by means of the laser radiation. The subsequent processes are the same as those shown in FIGS. 12 to 14. FIG. 33 shows a sectional view after the chip has been separated.

Hereinafter, a process of manufacturing a vertical LED element of this modified embodiment will be explained with reference to FIGS. 34 to 37. Here, FIGS. 34 to 37 are sectional views illustrating processing steps of manufacturing a vertical LED of FIG. 6.

Figure 34:
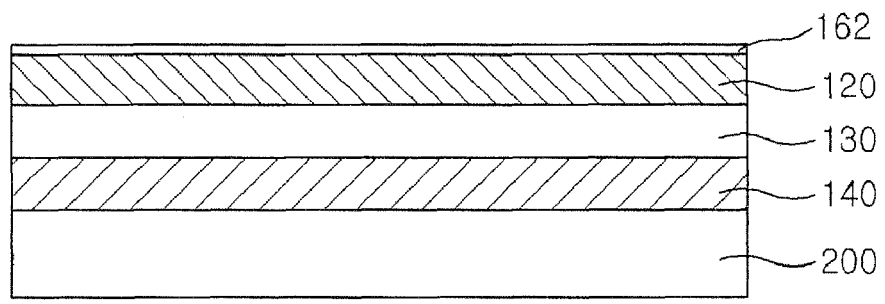

Referring to FIG. 34, a $SiO_2$ protective film 162 with a thickness of 0.05~5.0 microns is vapor-deposited on a desired substrate shown in FIG. 16 using a PECVD method.

Figure 35:
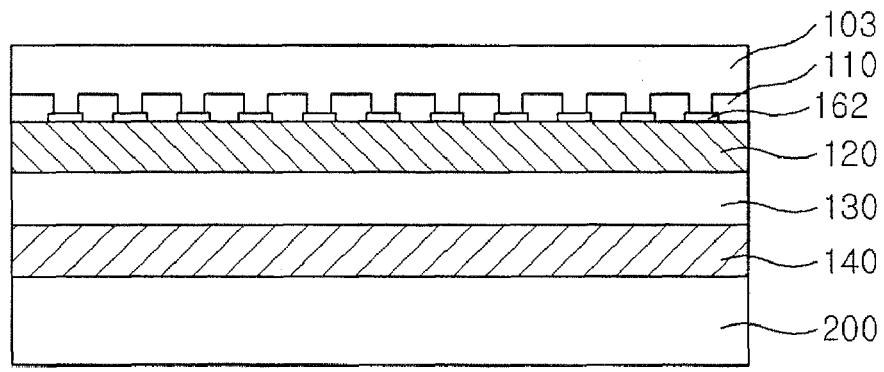

As shown in FIG. 35, a micro-pattern is formed in a mesh form. Using a photoresist as a mask, the $SiO_2$ protective film 162 is dry-etched using the BOE or $CF_4$ gas. A p-type reflective film ohmic metal is deposited on portions with the $SiO_2$ removed therefrom, and a p-type reflective film ohmic electrode 110 is then formed through the heat treatment. Ni and Au may be deposited with a thickness of several tens to several hundreds of nanometers using an e-beam evaporator. However, since reflectivity is important in case of a vertical LED shown in FIGS. 4 to 7, metals including Ni/Ag, Pt/Ag, Ru/Ag, Ir/Ag or the like are used. Then, the rapid thermal annealing is performed for several seconds to several minutes at a temperature of 300 to 600° C. to form the electrode. Thereafter, Ag or Al-based reflective film 103 is deposited on the p-type reflective ohmic electrode 110.

Figure 36:
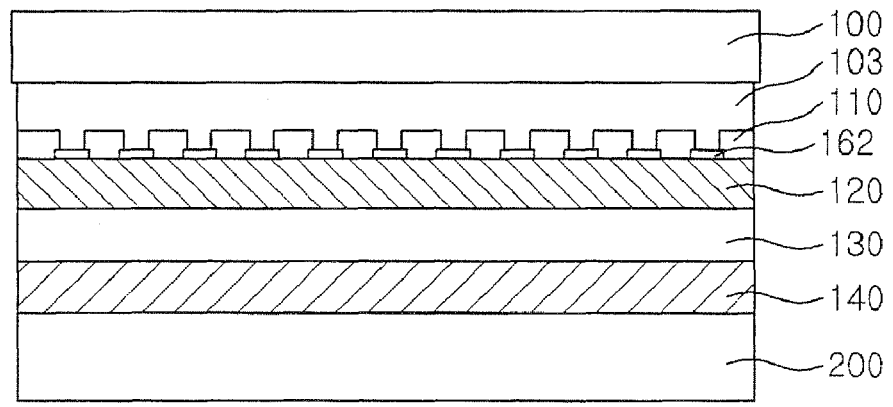
Figure 37:
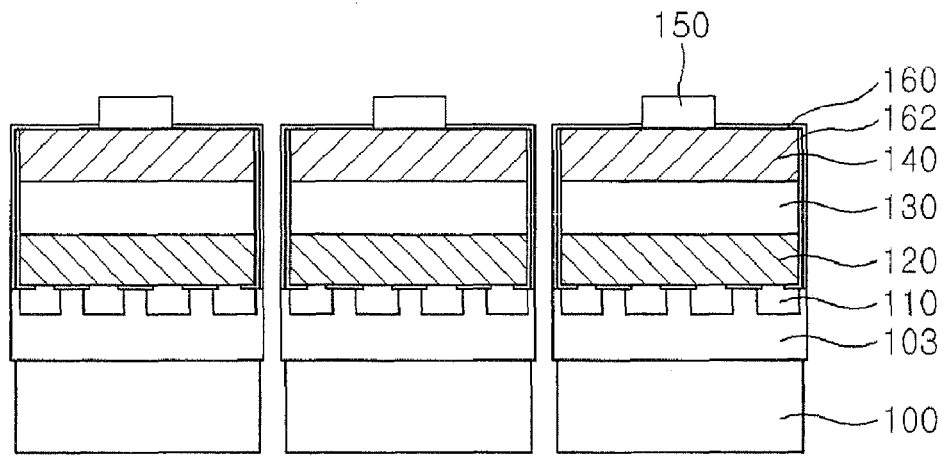

FIG. 36 shows a process of forming a metallic support layer 100 with a thickness of several microns to several tens of microns and radiating a laser. The metallic support layer 100 is formed through an electro-plating method, a vacuum vapor-deposition method such as sputtering, e-beam evaporation or thermal evaporation, or a wafer diffusion bonding method in which a metallic substrate is placed on a p-type electrode and they are pressed under a certain pressure at around 300° C. such that they are bonded to each other. When a laser is radiated through sapphire, the laser is absorbed in the GaN layer which in turn is decomposed into a Ga metal and $N_2$ gas. At this time, the metallic support layer 100 serves to prevent the GaN thin film layer with a thickness of about 4 microns from being destroyed when the sapphire substrate 200 is removed by means of the laser radiation. The subsequent processes are the same as those shown in FIGS. 20, 21 and 22. FIG. 37 shows a sectional view after the chip has been separated.

Next, a process of manufacturing a vertical LED element of this modified embodiment will be explained with reference to FIGS. 38 to 41. FIGS. 38 to 41 are sectional views illustrating processing steps of manufacturing a vertical LED of FIG. 7.

Figure 38:
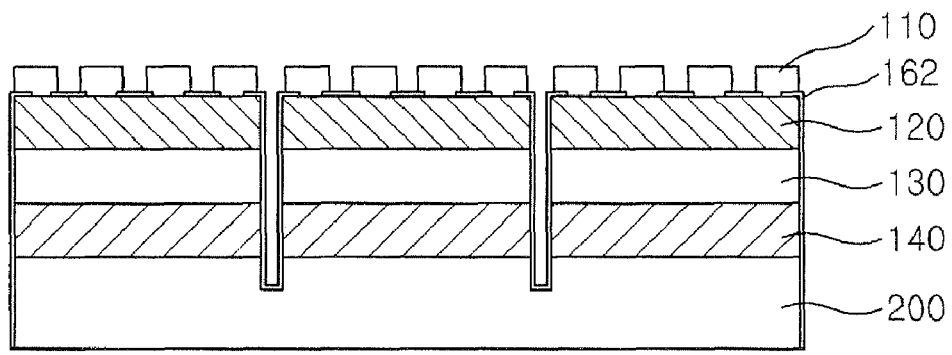

As shown in FIG. 38, after the process of FIG. 9 has been finished, a $SiO_2$ protective film 162 with a thickness of 0.05~5.0 microns is vapor-deposited over the whole surface using a PECVD method. Then, a micro-pattern is formed in a mesh form. Using a photoresist as a mask, the $SiO_2$ protective film 162 is dry-etched using the BOE or $CF_4$ gas. A p-type ohmic metal is deposited on portions with the $SiO_2$ removed therefrom, and a p-type reflective film ohmic electrode 110 is then formed through the heat treatment.

Here, Ni and Au may be deposited with a thickness of several tens to several hundreds of nanometers using an e-beam evaporator. However, since reflectivity is important in case of a vertical LED shown in FIGS. 4 to 7, metals including Ni/Ag, Pt/Ag, Ru/Ag, Ir/Ag or the like are used. Then, the rapid thermal annealing is performed for several seconds to several minutes at a temperature of 300 to 600° C. to form the electrode.

Figure 39:
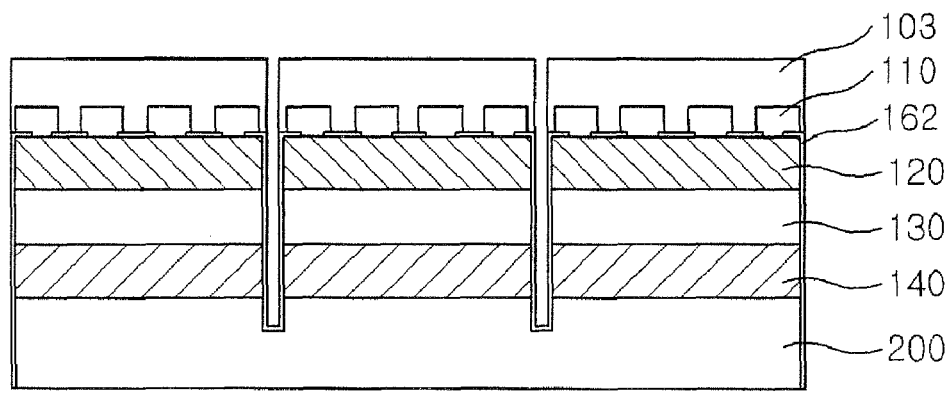
Figure 40:
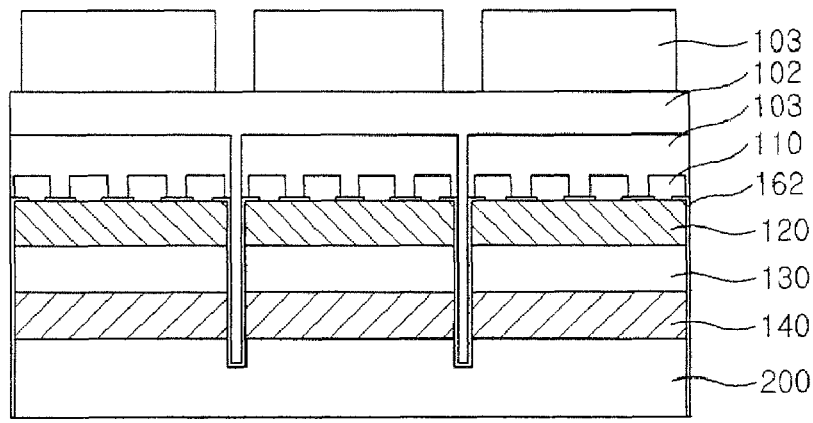
Figure 41:
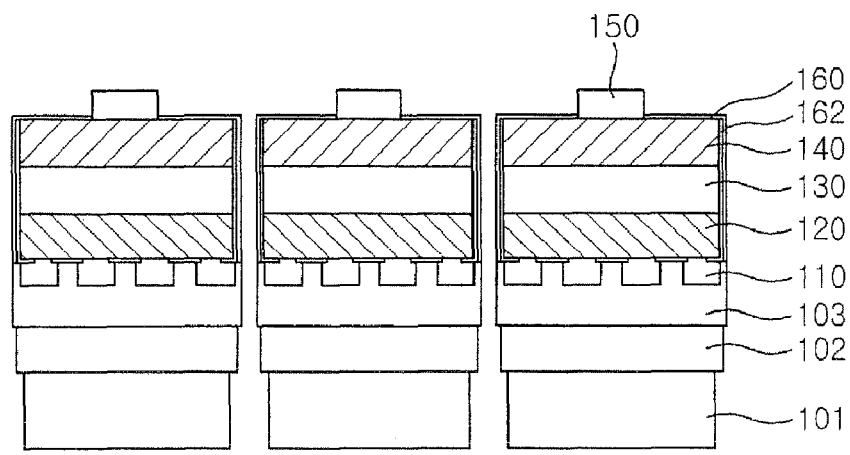

As shown in FIG. 39, Ag or Al-based reflective film is deposited on the p-type reflective ohmic electrode 110 in the form of a mesh. Then, as shown in FIG. 40, a first metallic support layer 102 is formed at a thickness of several microns to several tens of microns. A pattern is formed on an area corresponding to the chip using a photoresist film and a second metallic support layer 101 is then formed. Thereafter, a laser is radiated to remove the sapphire substrate 200. The first metallic support layer 102 is formed through an electro-plating method, a vacuum vapor-deposition method such as sputtering, e-beam evaporation or thermal evaporation, or a wafer diffusion bonding method in which a metallic substrate is placed on a p-type electrode and they are pressed under a certain pressure at around 300° C. such that they are bonded to each other. The second metallic support layer 101 is formed through an electroplating method, or a vacuum vapor-deposition method such as sputtering, e-beam evaporation or thermal evaporation. When a laser is radiated through sapphire, the laser is absorbed in the GaN layer which in turn is decomposed into a Ga metal and $N_2$ gas. At this time, the metallic support layer serves to prevent the GaN thin film layer with a thickness of about 4 microns from being destroyed when the sapphire substrate 200 is removed by means of the laser radiation. The subsequent processes are the same as those shown in FIGS. 12, 13 and 14. FIG. 41 shows a sectional view after the chip has been separated.

Next, a process of manufacturing a vertical LED element of this modified embodiment will be explained with reference to FIGS. 42 to 45. Here, FIGS. 42 to 45 are sectional views showing processing steps of manufacturing a vertical LED of FIG. 7.

Figure 42:
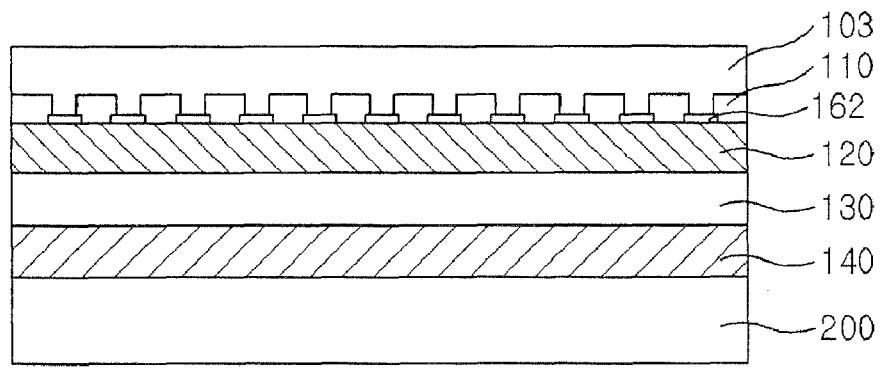

Referring to FIG. 42, a $SiO_2$ protective film 162 with a thickness of 0.05~5.0 microns is vapor-deposited on a desired substrate of FIG. 16 using a PECVD method. Then, a micro-pattern is formed in a mesh form. Using a photoresist as a mask, the $SiO_2$ protective film 162 is dry-etched using the BOE or $CF_2$ gas. A p-type reflective film ohmic metal is deposited on portions with the $SiO_2$ removed therefrom, and a p-type reflective film ohmic electrode 110 is then formed through the heat treatment. Generally, Ni and Au may be deposited with a thickness of several tens to several hundreds of nanometers using an e-beam evaporator. However, since reflectivity is important in case of a vertical LED shown in FIGS. 4 to 7, metals including Ni/Ag, Pt/Ag, Ru/Ag, Ir/Ag or the like are used. Then, the rapid thermal annealing is performed for several seconds to several minutes at a temperature of 300 to 600° C. to form the electrode. Thereafter, Ag or Al-based reflective film 103 is deposited on the p-type reflective ohmic electrode 110.

Figure 43:
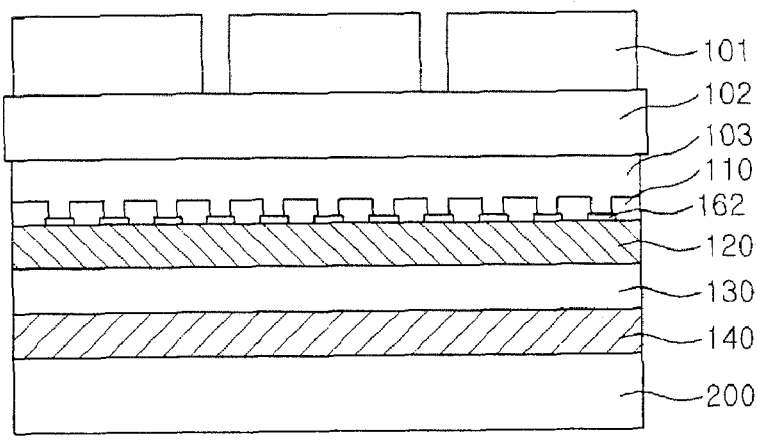

As shown in FIG. 43, a first metallic support layer 102 is formed at a thickness of several microns to several tens of microns. A pattern is formed on an area corresponding to the chip using a photoresist film and a second metallic support layer 101 is then formed. Thereafter, a laser is radiated to remove the sapphire substrate 200. The first metallic support layer 102 is formed through an electroplating method, a vacuum vapor-deposition method such as sputtering, e-beam evaporation or thermal evaporation, or a wafer diffusion bonding method in which a metallic substrate is placed on a p-type electrode and they are pressed under a certain pressure at around 300° C. such that they are bonded to each other. The second metallic support layer 101 is formed through an electroplating method, or a vacuum vapor-deposition method such as sputtering, e-beam evaporation or thermal evaporation. When a laser is radiated through sapphire, the laser is absorbed in the GaN layer which in turn is decomposed into a Ga metal and $N_2$ gas. At this time, the metallic support layer serves to prevent the GaN thin film layer with a thickness of about 4 microns from being destroyed when the sapphire substrate 200 is removed by means of the laser radiation.

Figure 44:
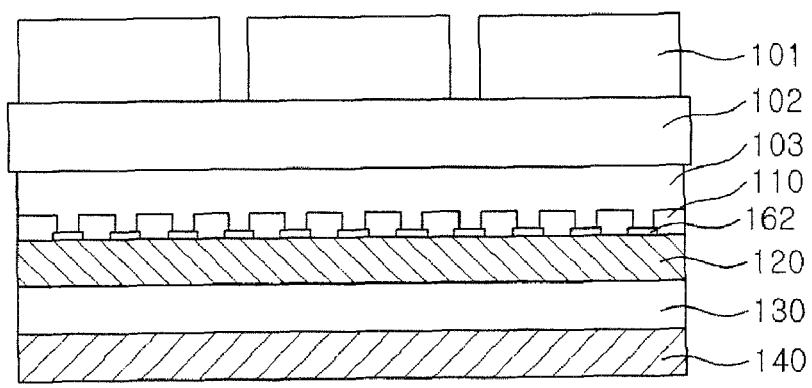

FIG. 44 shows a sectional view after the sapphire substrate 200 has been removed.

Figure 21:
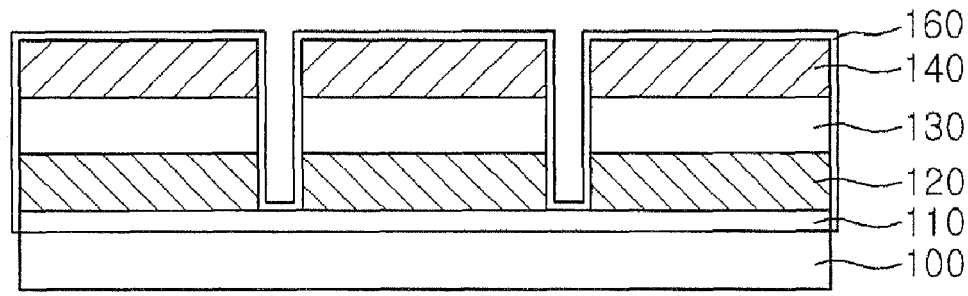
Figure 22:
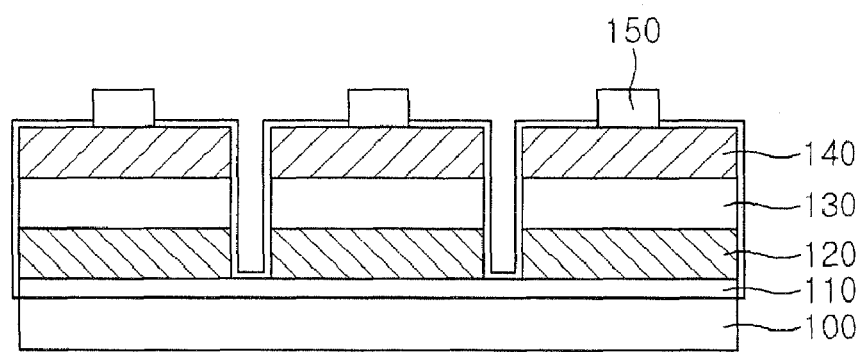
Figure 23:
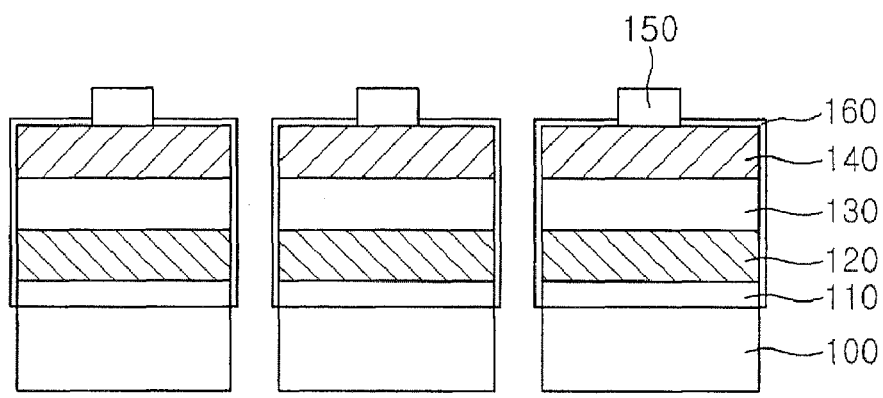
Figure 45:
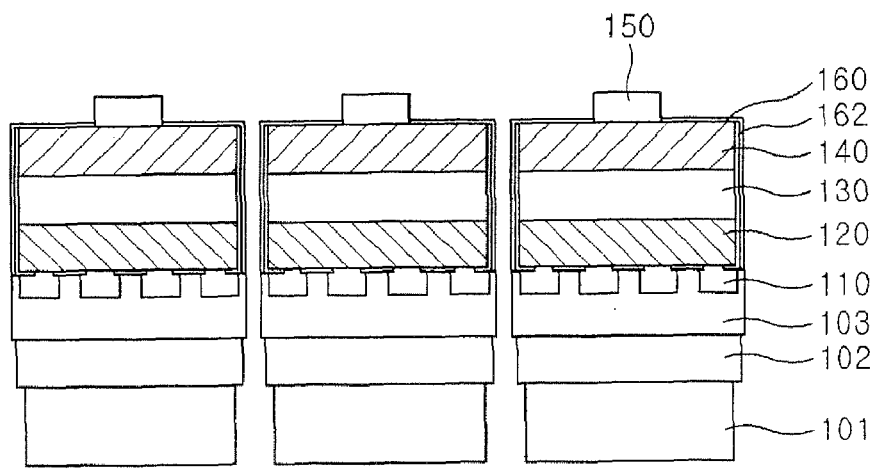

The subsequent processes are the same as those shown in FIGS. 20, 21 and 22. FIG. 45 shows a sectional view after the chip has been separated.

The vertical LED element of the present invention may be manufactured through a variety of processes of manufacturing a semiconductor device in addition to the above described process. That is, the respective layers may be formed through various other deposition processes. The etching process may be performed using a wet- or dry-etching method. Further, the patterning process may use a barrier film instead of the photoresist film.

Figure 46:
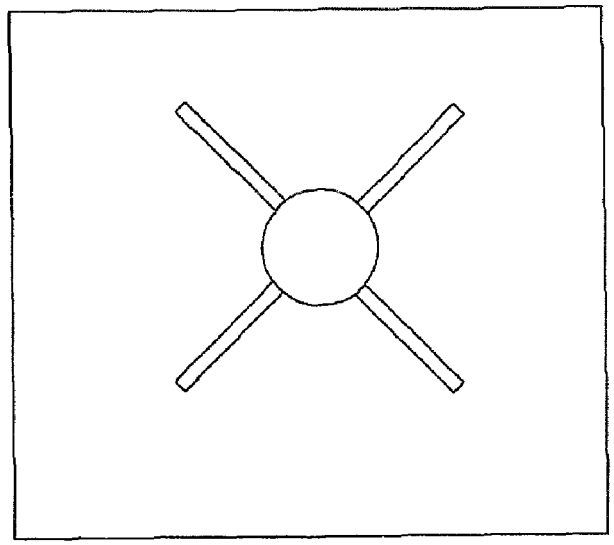
FIG. 46 is a plan view illustrating an n-type electrode structure.

FIG. 46 is a plan view illustrating an n-type electrode structure.

As shown in FIG. 46, if an X-shaped branch is installed around an n-type electrode pad, the diffusion resistance of current can be reduced. Therefore, since electrons can be uniformly injected, optical output can be improved. Of course, the present invention is not limited thereto, but a variety of shapes of N-type electrodes can be employed to improve the optical output.

Figure 47:
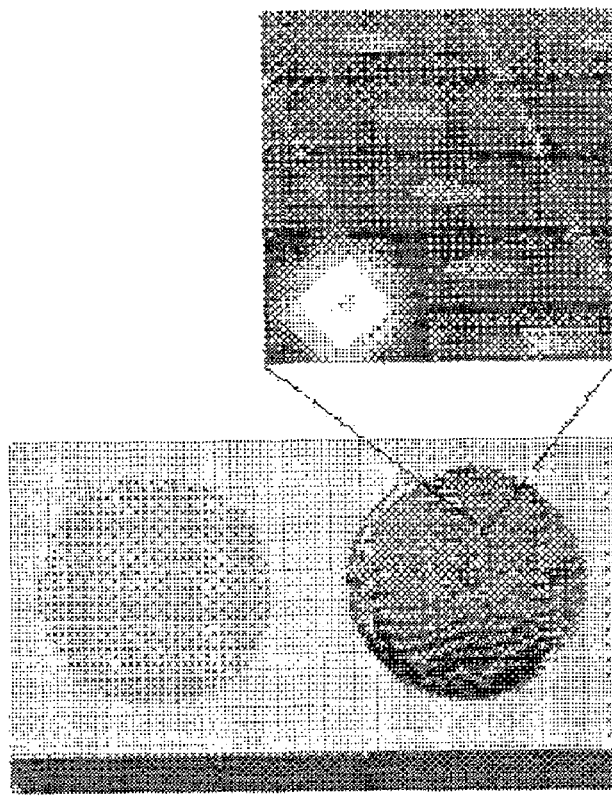
FIG. 47 is an SEM photograph of the LED element according to the present invention.

FIG. 47 is an SEM photograph of the LED element according to the present invention.

More specifically, FIG. 47 is an SEM photograph showing a two-inch substrate, from which the sapphire is removed through the process illustrated in FIGS. 8 to 15 according to the present invention, and LED elements arranged on the substrate, using a scanning electron microscope. It can be seen from FIG. 47 that the sapphire has been completely removed from the two-inch substrate and all the elements formed therein are kept at a good state.

Figure 48:
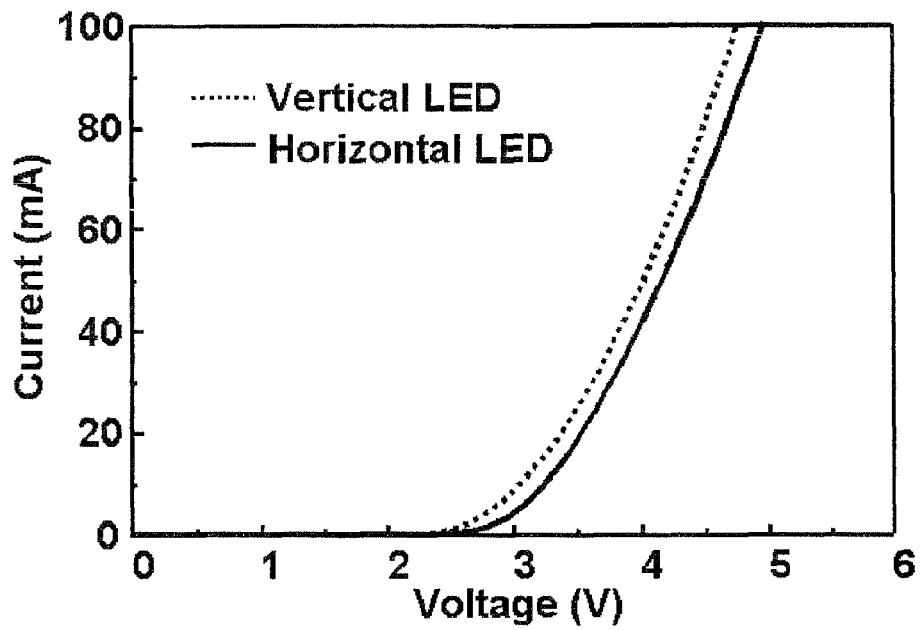
FIGS. 48 and 49 are graphs plotting comparison results of electrical and optical characteristics of the vertical LED element manufactured according to the first embodiment of the present invention and a conventional horizontal LED element.
Figure 49:
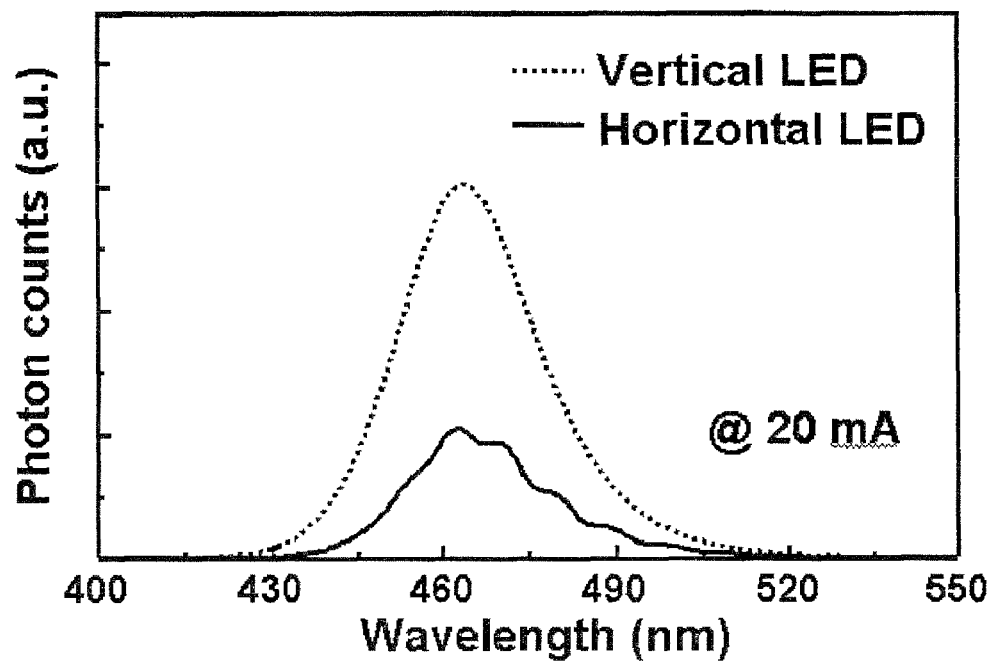

FIGS. 48 and 49 are graphs plotting comparison results of electrical and optical characteristics of the vertical LED element manufactured according to the first embodiment of the present invention and the conventional horizontal LED element.

FIG. 48 is a graph plotting comparison results of current-voltage characteristics of the horizontal and vertical LED elements. It has been found that, when the injection current is 20 mA, the forward voltage of the vertical LED is 3.3 V which is lower by 0.2 V than 3.5 V of the horizontal LED. Thus, it indicates that the vertical LED has lower power consumption than the horizontal LED. FIG. 49 shows comparison results of the optical output characteristics of the horizontal and vertical LED elements, which indicates that the latter has the optical output characteristics at least 2.5 times greater than the former. This means that the vertical LED emits light 2.5 times brighter than that of the horizontal LED at the same power consumption level.

Figure 50:
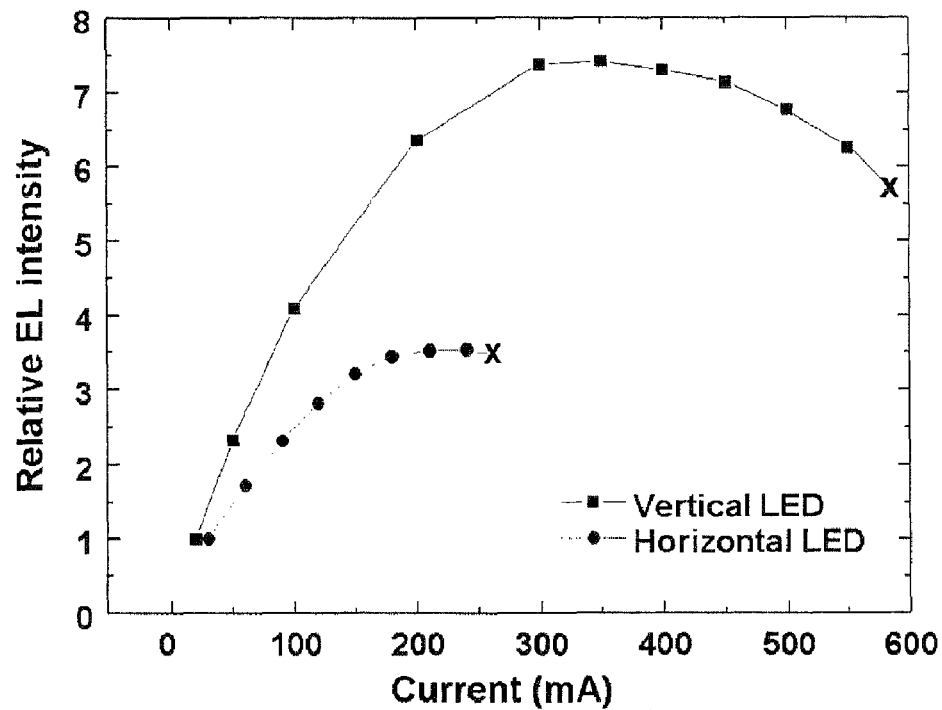
FIG. 50 is a graph plotting comparison results of optical output characteristics with respect to an injection current in a conventional horizontal LED and a vertical LED of the present invention.

FIG. 50 is a graph plotting comparison results of optical output characteristics with respect to an injection current in the conventional horizontal LED and the vertical LED of the present invention.

Figure 2:
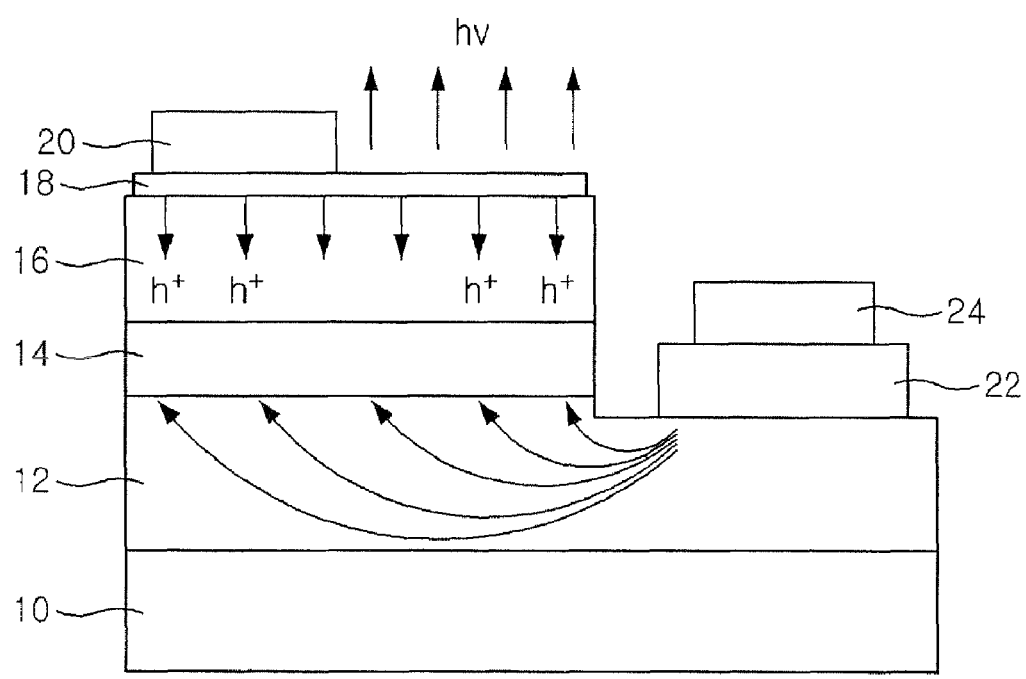
FIG. 2 is a sectional view of a horizontal LED.
Figure 3:
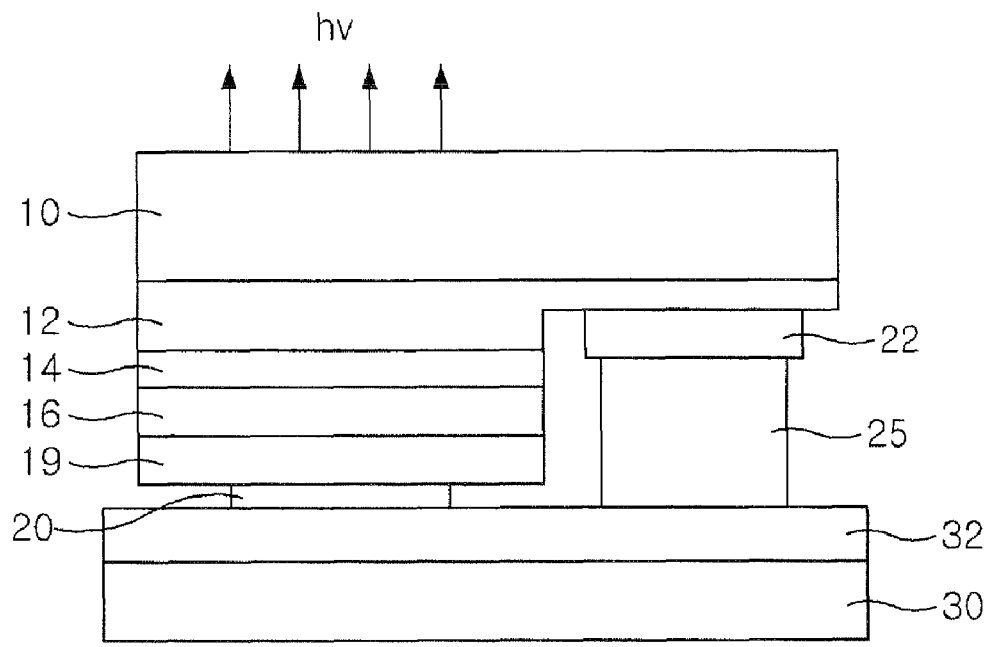
FIG. 3 is a sectional view of a flip-chip LED.

That is, the optical output characteristics with respect to the injection current are examined for the horizontal LED of FIG. 2 and the vertical LED of FIG. 4 manufactured through the process of FIGS. 8 to 15. It can be seen from FIG. 50 that the vertical LED emits light about 2.5 times brighter than that of the horizontal LED.

Figure 51:
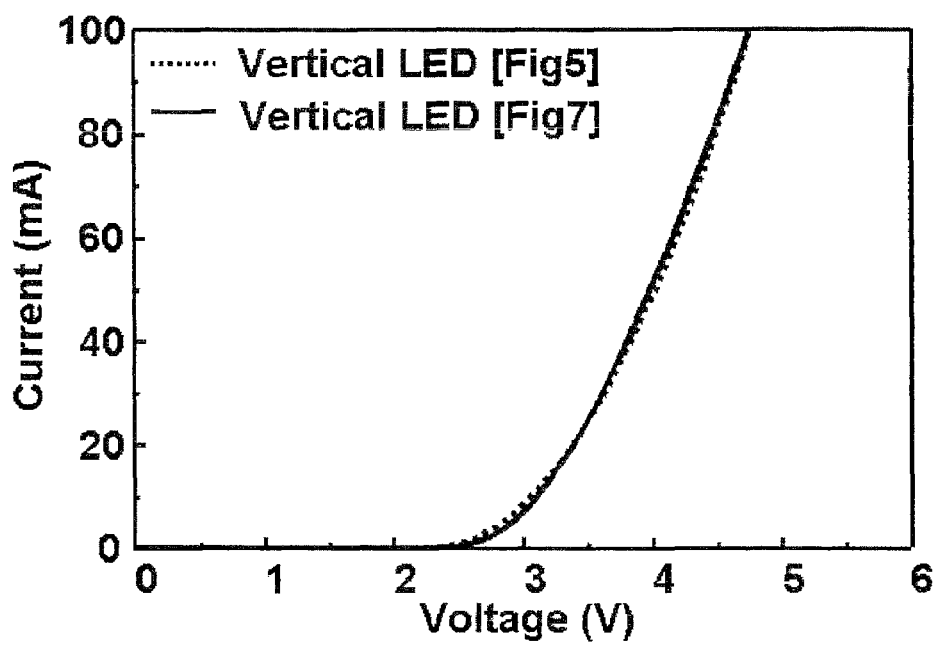
FIGS. 51 and 52 are graphs plotting comparison results of electrical and optical characteristics of the vertical LED elements manufactured by the process illustrated in FIGS. 30 to 33 and 8 to 15.
Figure 52:
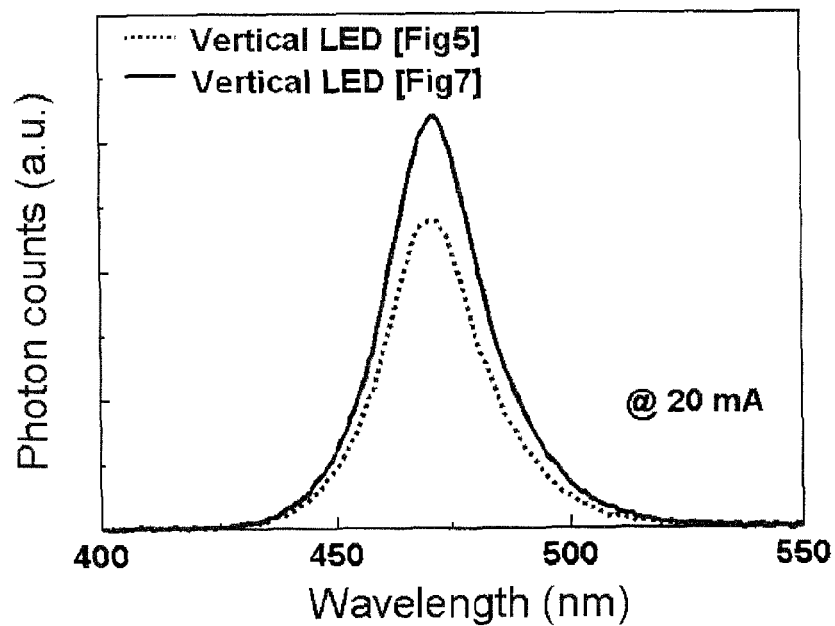

FIGS. 51 and 52 are graphs plotting comparison results of electrical and optical characteristics of the vertical LED elements manufactured by the process illustrated in FIGS. 30 to 33.

Here, an Ag film obtained by thermally depositing pure Ag of above 99% at a thickness of 500 nm has been used as a reflective film. FIG. 51 is a graph plotting comparison results of the current-voltage characteristics of the vertical LED elements manufactured through the processes of FIGS. 30 to 33 and FIGS. 8 to 15 according to the present invention. When the injection current is 20 mA, the forward voltages of both elements are 3.3 V. FIG. 52 is a graph plotting comparison results of optical output characteristics of the vertical LED elements manufactured through the processes of FIGS. 30 to 33 and FIGS. 8 to 15 according to the present invention. It can be seen from FIG. 52 that the optical output characteristics have been improved by at least 20%. This is because the Ag-film has a reflectivity of at least 98%. That is, it has been confirmed that the optical characteristic of the vertical LED element can be improved by at least 20% through the process illustrated in FIGS. 30 to 33.

The present invention is not limited to the foregoing. For example, the epitaxially grown GaN substrate can be protected by forming an insulation film on a lateral surface of the element and then coating a metallic protective film layer on a top surface of the P-type electrode and the lateral surface of the element. Hereinafter, a vertical LED having a metallic protective film layer according to a second embodiment of the present invention will be described.

Figure 53:
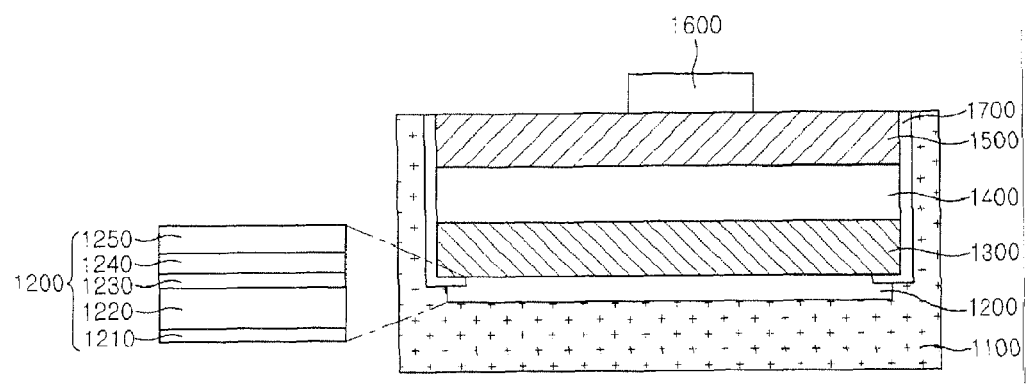
FIGS. 53 to 58 are sectional views of a vertical LED according to a second embodiment of the present invention.

FIG. 53 is a sectional view of a vertical LED according to the second embodiment of the present invention. FIGS. 54 to 58 are sectional views of a vertical LED according to modified embodiments of the present invention.

Figure 54:
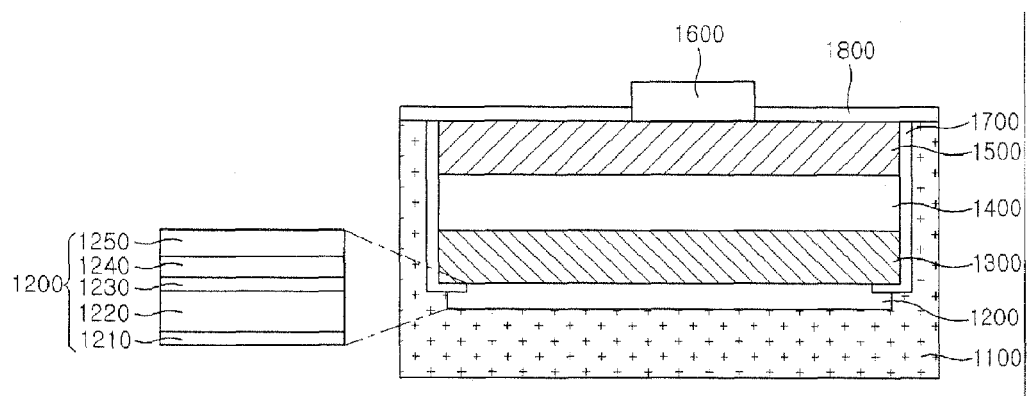
Figure 55:
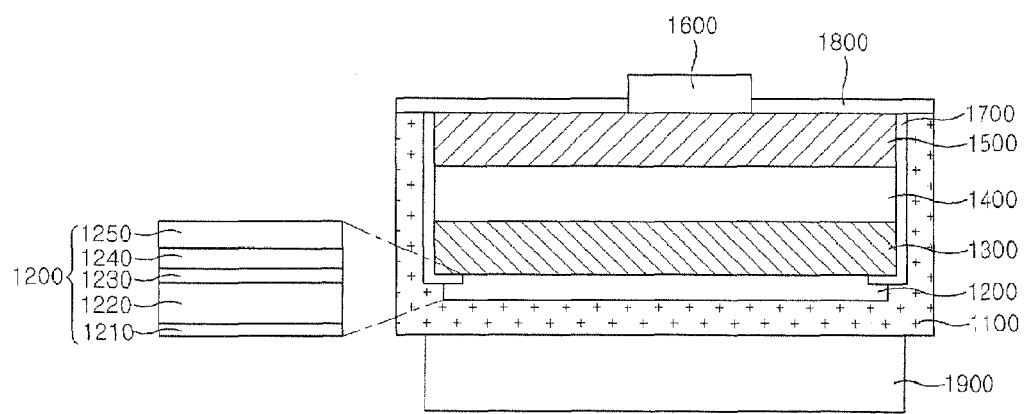

Referring to FIG. 53, the vertical GaN LED is configured in such a manner that an insulation film 1700 is first coated on the lateral surface of the element composed of a P-type semiconductor layer 1300, an active layer 1400 and an N-type semiconductor layer 1500, and a metallic protective film layer 1100 is then coated on a bottom surface of a P-type electrode 1200 and a lateral face of the insulation layer to protect an epitaxially grown GaN substrate with a thickness of merely 4~5 microns. That is, the thick metallic protective film layer 1100 with a thickness of 10 microns or more is provided on the bottom and lateral surfaces of the element, and then, the P-type electrode 1200, P-type semiconductor layer 1300, active layer 1400, N-type semi-conductor layer 1500 and N-type electrode 1600 are sequentially provided on the metallic protective film layer. As shown in FIG. 54, a second vertical GaN LED structure according to a modified example of the second embodiment is based on the first structure of the second embodiment according to the present invention, but different in that an anti-reflective coating 1800 is provided on the light-emitting N-type semiconductor layer to thereby improve the optical characteristics and durability of the vertical GaN LED. As shown in FIG. 55, a third structure is also based on the first structure but is different in that a thick metallic support layer 1900 is coated beneath the metallic protective film layer 1100 to enable easy chip separation. At this time, the underlying metallic support layer 1900 serves as bridge posts between which an empty space is provided. Therefore, the chip can be easily separated since the metallic support layer 1900 has a structure in which a pressing force can be mechanically applied to a position between the two bridge posts.

Figure 56:
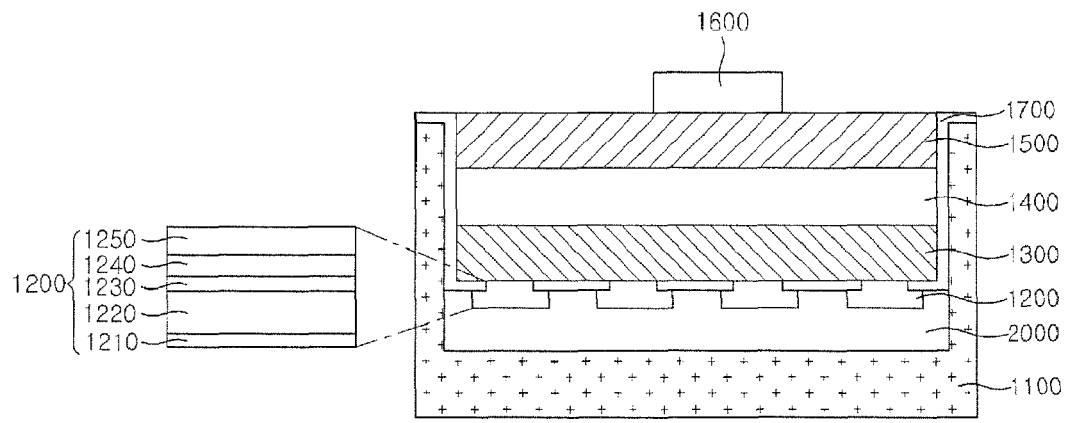
Figure 57:
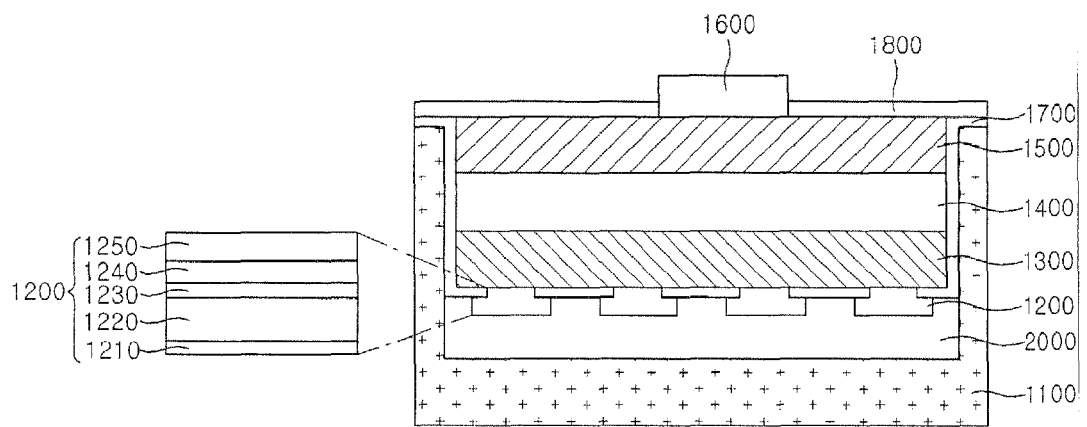
Figure 58:
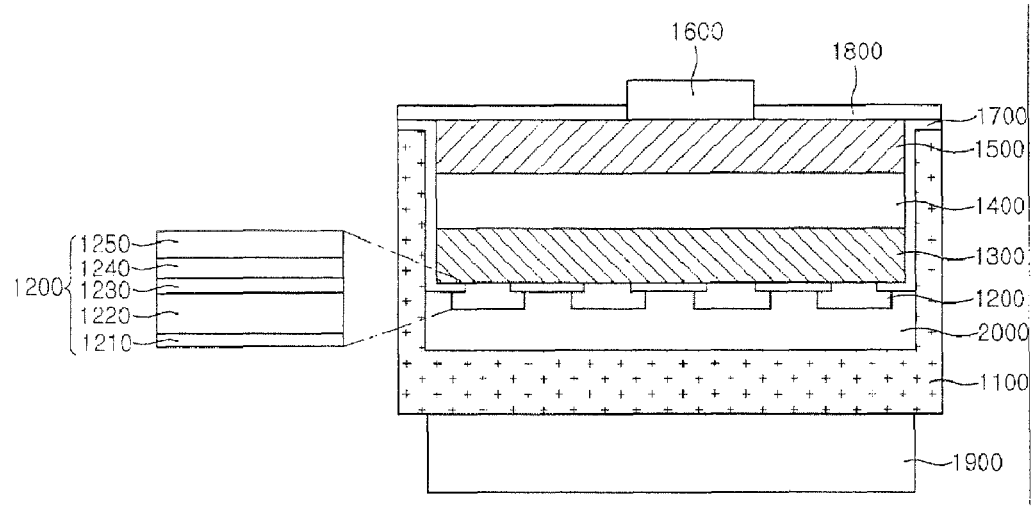

As illustrated in FIG. 56, a fourth vertical GaN LED structure is also based on the first structure, but is different in that P-type electrodes 1200 are partially formed on the P-type semiconductor layer in the form of a mesh and a reflective layer 2000 is then inserted between the partially formed electrodes to thereby maximize the emission of photons generated from the active layer 1400 toward the N-type semiconductor layer 1500. As shown in FIG. 57, a fifth vertical GaN LED structure is based on the aforementioned fourth structure, but is different in that an anti-reflective coating is further provided on the light-emitting N-type semiconductor layer 1500 to thereby improve the optical characteristics and durability of the vertical GaN LED. As shown in FIG. 58, a sixth vertical GaN LED structure is also based on the fifth structure, but is different in that a thick metallic support layer 1900 is coated beneath the metallic protective film layer 1100 to thereby enable the easy chip separation.

Referring to FIG. 53 to FIG. 58, the vertical GaN LED comprises the P-type semi-conductor layer 1300, the active layer 1400 and N-type semiconductor layer 1500 formed on the P-type semiconductor layer, the N-type electrode 1600 formed on the N-type semiconductor layer 1500, and the metallic protective film layer 1100 for protecting the P-type semiconductor layer 1300, active layer 1400 and N-type semi-conductor layer 1500. Here, the metallic protective film layer 1100 is formed on the lateral sides of the P-type semiconductor layer 1300, active layer 1400 and N-type semiconductor layer 1500, and below the P-type semiconductor layer 1500. In addition, the P-type electrode 1200 is further provided between the metallic protective film layer 1100 and the P-type semiconductor layer 1300. Preferably, the P-type electrode 1200 is formed in a mesh form. Further, the insulation film 1700 is further provided between the metallic protective film layer 1100 and the lateral sides of the N-type semiconductor layer 1500, active layer 1400 and P-type semiconductor layer 1300. Furthermore, the reflective layer 2000 may be further formed between the P-type semiconductor layer 1300 and the metallic protective film layer 1100. The metallic support layer 1900 may be further formed beneath the metallic protective film layer 1100.

The vertical GaN LED of this embodiment shown in FIG. 53 comprises the P-type electrode 1200, the P-type semiconductor layer 1300, the active layer 1400, the N-type semiconductor layer 1500 and the N-type electrode 1600, which are sequentially formed. The insulation film 1700 is formed to protect the lateral sides of the P-type semiconductor layer 1300, active layer 1400 and N-type semiconductor layer 1500. The metallic protective film layer 1100 is also formed around the insulation film 1700 and P-type electrode 1200. At this time, the insulation film 1700 may be formed only on the lateral side of the N-type semiconductor layer 1500 or on the lateral side of the P-type semiconductor layer 1300. As shown in FIG. 54, the vertical GaN LED of this modified example is provided with the anti-reflective layer 1800 formed on the N-type semiconductor layer 1500 of the vertical GaN LED shown in FIG. 53, thereby providing an advantageous effect of inhibiting light reflection. The vertical GaN LED of FIG. 55 is provided with the metallic support layer 1900 formed beneath the metallic protective film layer 1100 of the vertical GaN LED shown in FIG. 54. The vertical GaN LED of FIG. 56 comprises the reflective layer 2000; the P-type electrode 1200 formed on the reflective layer 2000 in a mesh form; the P-type semiconductor layer 1300, active layer 1400, N-type semiconductor layer 1500 and N-type electrode 1600 which are sequentially formed on the P-type electrode 1200; the insulation film 1700 formed on the lateral sides of the P-type semiconductor layer 1300, active layer 1400 and N-type semiconductor layer 1500; and the metallic protective film layer 1100 formed to wrap around the insulation film 1700 and reflective layer 2000. Here, as shown in the figure, the insulation film 1700 may be partially formed on the bottom surface of the P-type semiconductor layer 1300. The vertical GaN LED of FIG. 57 is provided with the anti-reflective layer 1800 formed on the N-type semiconductor layer 1500 of the vertical LED shown in FIG. 56. The vertical LED of FIG. 58 is provided with the metallic support layer 1900 formed beneath the metallic protective film layer 1100 of the vertical LED illustrated in FIG. 57.

Preferably, an ohmic electrode layer with good thermal stability and a high reflectivity of at least 90% is used as the P-type electrode 1200 formed on the underside of the P-type semiconductor layer 1300. This ohmic electrode layer, i.e. the P-type electrode 1200, includes a contact metallic layer 1210, a reflective metallic layer 1220, a diffusion barrier layer 1230 and bonding metallic layers 1240 and 1250. The whole thickness of the P-type electrode 1200 is 300~23000 Å, preferably 2000~5000 Å.

Here, the contact metallic layer 1210 has a thickness of 5~500 Å, preferably no more than 200 Å. The thickness of the contact metallic layer 1210 is restricted to the above range to control the amount of light absorption. In addition, the contact metallic layer 1210 may be formed in a multi-layered thin film. The contact metallic layer 1210 is formed of at least one of Ni, Ir, Pt, Pd, Au, Ti, Ru, W, Ta, V, Co, Os, Re and Rh, preferably of a laminated metal of Ni, Ir and Pt.

The reflective metallic layer 1220 has a thickness of 100~9000 Å, preferably 1000~2000 Å. The reflective metallic layer 1220 is formed of Al and/or Ag, preferably of Ag.

The diffusion barrier layer 1230 has a thickness of 50~1000 Å, preferably 100~800 Å. The diffusion barrier layer 1230 is formed of at least one of Ru, Ir, Re, Rh, Os, V, Ta, W, ITO (Indium Tin Oxide), IZO (Indium Zinc Oxide), $RuO_2$, $VO_2$, MgO, $IrO_2$, $ReO_2$, $RhO_2$, $OsO_2$, $Ta_2O_3$ and $WO_2$, preferably of Ru.

The bonding metallic layers are composed of first and second bonding metallic layers 1240 and 1250. The first bonding metallic layer 1240 has a thickness of 100~3000 Å, preferably no more than 1000 Å. The first bonding metallic layer 1240 is formed of at least one of Ni, Cr, Ti, Pd, Ru, Ir, Rh, Re, Os, V and Ta, preferably of Ni.

The second bonding metallic layer 1250 has a thickness of 100~9000 Å, preferably no more than 1000 Å. The second bonding metallic layer 1250 is formed of at least one of Au, Pd and Pt, preferably of Au.

The aforementioned P-type electrode may be formed in such a manner that the contact metallic layer, reflective metallic layer and diffusion barrier layer are sequentially laminated and heat treated, and the first and second bonding metallic layers are then laminated or that the contact metallic layer, reflective metallic layer, diffusion barrier layer, and first and second bonding metallic layers are sequentially formed and then heat treated. Thus, Me (=Ir, Ni, Pt)/Ag/Ru/Ni/Au are sequentially laminated on the P-type semiconductor layer to obtain a P-type electrode having both reflective film property and low contact resistance property.

Hereafter, a method of manufacturing a vertical LED element according to the second embodiment of the present invention so configured will be explained.

FIGS. 59 to 66 are a series of sectional views illustrating a process of manufacturing the vertical LED element according to the second embodiment of the present invention.

Figure 59:
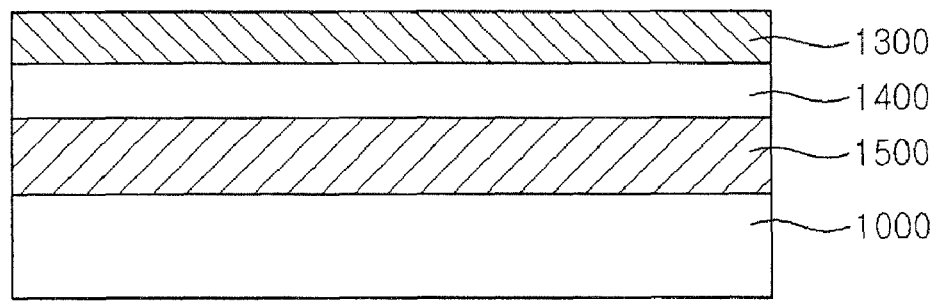
FIGS. 59 to 66 are a series of sectional views illustrating a process of manufacturing the vertical LED element according to the second embodiment of the present invention.

FIG. 59 is a sectional view of a common GaN LED substrate. On a sapphire substrate 1000 are sequentially grown an N-type semiconductor layer 1500, an active layer 1400 and a P-type semiconductor layer 1300. The total thickness of thin film is approximately 4 microns. The thin film is deposited through a MOCVD method.

The substrate 1000 is formed of at least one of $Al_2O_3$, SiC, ZnO, Si, GaAs, GaP, $LiAl_2O_3$, BN, A lN and GaN. In this embodiment, a sapphire substrate is employed. In this embodiment, a buffer layer that serves as a buffer when forming an N-type semi-conductor layer 1500 may be further provided on the aforementioned substrate. The N-type semiconductor layer 1500 preferably employs a GaN film doped with N-type impurities, but not limited thereto. That is, a variety of material layers having a semi-conductor property may be used. In this embodiment, the N-type semiconductor layer 1500 is formed to include an N-type $Al_xGa_{1-x}N$ film, where $0 \leq x \leq 1$. Further, the P-type semiconductor 1300 also employs a GaN film doped with P-type impurities. In this embodiment, the P-type semiconductor layer 1300 is formed to include a P-type $Al_xGa_{1-x}N$ film, where $0 \leq x \leq 1$. In addition, an InGaN film may be used as the semi-conductor layer film. Furthermore, the N-type semiconductor layer 1500 and P-type semiconductor layer 1300 may be formed in a multi-layered film. In the above, the N-type dopant is Si, and the P-type dopant is Zn when using InGaAlP or Mg when using nitrides.

The active layer 1400 employs a multi-layered film in which quantum well layers and barrier layers are repeatedly formed. The barrier layers and quantum well layers may be formed of a binary compound such as GaN, InN and AlN, a ternary compound such as $In_xGa_{1-x}N$ ($0 \leq x \leq 1$) and $Al_xGa_{1-x}N$ ($0 \leq x \leq 1$), or a quaternary compound such as $Al_xIn_yGa_{1-x-y}N$ ($0 \leq x+y \leq 1$). Of course, the binary to quaternary compounds may be doped with desired impurities to form the N-type and P-type semiconductor layers 1500 and 1300.

Figure 60:
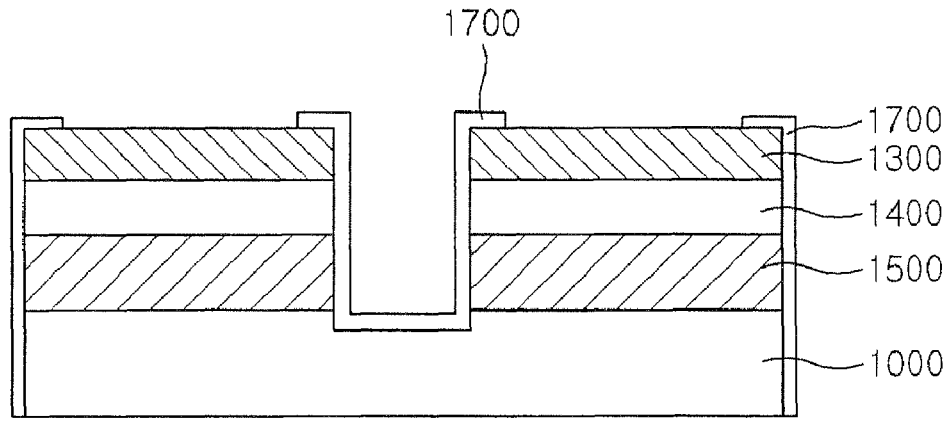

FIG. 60 shows a process of etching an area other than the element region. Typically, the etching process is performed through a dry-etching method in a state where $Cl_2$ gas flows after a substrate is masked using photoresist or $SiO_2$. The dry etching process is completed and the etching mask is then removed. Thereafter, an insulation film 1700 is deposited on the lateral side of the element by depositing the insulation film 1700 on the whole surface thereof.

Figure 61:
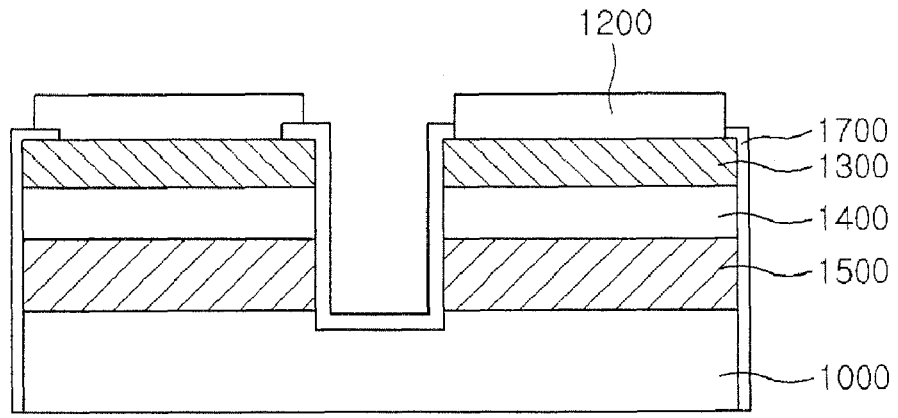

Referring to FIG. 61, a portion on which a P-type reflective film ohmic electrode will be formed is etched and a P-type electrode 1200 is then formed on. On the substrate etched for the element isolation is formed the $SiO_2$ protective film 1700 with a thickness of 0.05~5.0 microns through a PECVD method. In order to form a reflective film ohmic electrode 1200, a micro pattern is formed and an etching process is then performed using BOE or $CF_4$ gas through a dry-etching method and using a photoresist as a mask. Thereafter, a metallic ohmic layer is deposited.

The surface treatment of the P-type semiconductor layer 1300 exposed before the ohmic metallic layer is deposited is performed in such a manner that the P-type semi-conductor layer 1300 is immersed in aqua regia solution ($HCl:H_2O=3:1$) for ten minutes and is then rinsed with deionized water and dried with nitrogen gas.

Before depositing a metal, the P-type semiconductor layer is surface-treated by immersing it in a solution of HCl and deionized water mixed at a ratio of 1:1 for one minute, and then loaded in an e-beam evaporator in which metallic electrode/Ag/Ru/Ni/Au (Me=Ir, Ni, Pt) layers 1210, 1220, 1230, 1240 and 1250 are sequentially deposited to form an ohmic electrode. Thereafter, the ohmic electrode is heat-treated using rapid thermal annealing equipment at a temperature of 100~700° C. for at least ten seconds under oxygen atmosphere or an atmosphere containing at least 5% oxygen. That is, it preferred that the ohmic electrode is heat treated at the temperature of 100~700° C. for 10~100 seconds under an atmosphere containing 5~100% oxygen. Then, the electrical property is measured to calculate the contact resistance of the ohmic electrode.

Preferably, the contact metallic layer (Me=Ir, Ni, Pt) 1210, Ag layer 1220, Ru layer 1230 are sequentially deposited on the P-type semiconductor layer 1300 and then heat treated under the oxygen atmosphere. At this time, since the diffusion barrier layer 1230, i.e. the Ru layer, has been formed on the reflective metallic layer, i.e. the Ag layer 1220, the Ag layer 1220 can be prevented from being diffused or oxidized during the heat treatment. Next, the Ni layer 1240 and Au layer 1250 are deposited on the Ru layer 1230 to form the ohmic electrode.

Alternatively, a dense ohmic electrode may be formed by sequentially forming the contact metallic layer (Me=Ir, Ni, Pt) 1210, Ag layer 1220, Ru layer 1230, Ni layer 1240 and Au layer 1250 and then heat treating the sequentially formed layers under the oxygen atmosphere. After forming the ohmic electrode, a desired patterning process may be carried out to obtain a pattern targeted for the ohmic electrode on the P-type semiconductor layer 1300. Of course, the ohmic electrode may be formed on an N-type nitride layer.

The insulation film 1700 can be formed only on the lateral sides of the N-type semi-conductor layer 1500 and active layer 1400. Although the insulation film 1700 is formed on the whole structure and a part of the insulation film 1700 formed on the P-type semiconductor layer 1300 is then etched as described above, the present invention is not limited thereto. That is, a portion of the insulation film 1700 except the insulation film 1700 formed on the lateral sides of the N-type semiconductor layer 1500 and active layer 1400 may be removed after forming a desired mask on the P-type semi-conductor layer 1300 to protect a part of the semiconductor layer 1300 and then forming the insulation film 1700 on the whole structure.

Figure 62:
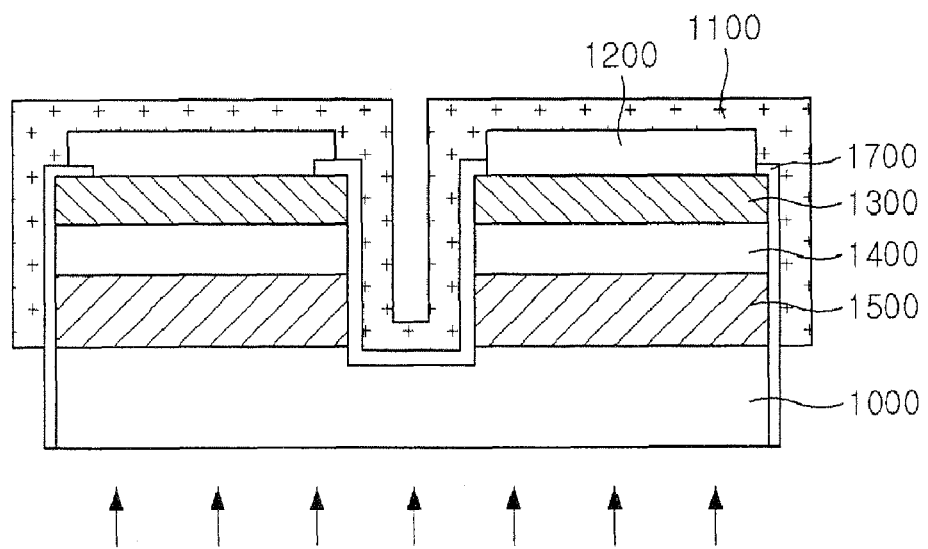

FIG. 62 shows a process of forming a metallic protective layer 1100 with a thickness of several microns to several tens of microns and radiating a laser. The metallic protective layer 1100 is formed through an electroplating method and a vacuum vapor-deposition method such as sputtering, e-beam evaporation or thermal evaporation. When a laser is radiated through sapphire, the laser is absorbed in the GaN layer which in turn is decomposed into a Ga metal and N gas. At this time, the metallic protective layer 1100 serves to prevent the GaN thin film layer with a thickness of about 4 microns from being destroyed when the sapphire substrate 1000 is removed by means of the laser radiation. At this time, a part of the insulation film may be removed together with the sapphire substrate.

Figure 63:
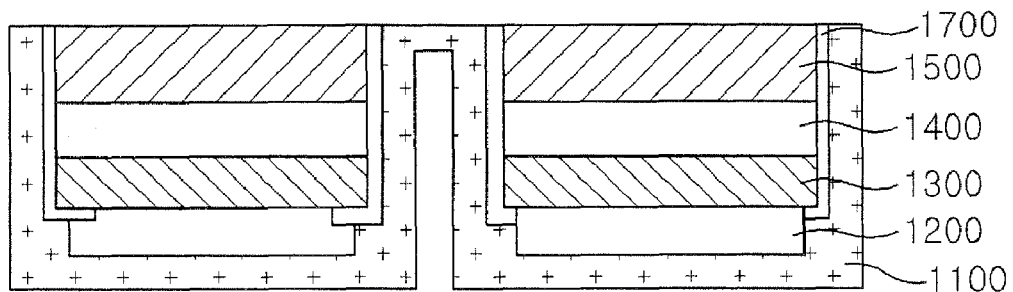

FIG. 63 shows a state where a GaN thin film layer is wrapped around and protected by the metallic protective layer 1100 after the sapphire substrate 1000 has been removed.

Figure 64:
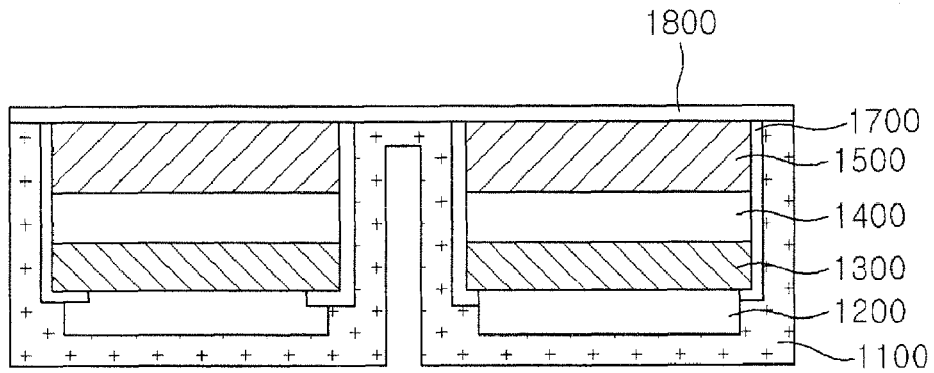

Next, as shown in FIG. 64, an anti-reflective layer 1800 is coated on the N-type semiconductor layer 1500 such that photons generated in the active layer (i-InGaN) 1400 can be emitted to the outside of the substrate. The anti-reflective layer 1800 is formed of $SiO_2$, $Si_3N_4$, ITO, IZO or the like which is deposited through the PECVD, sputter, or e-beam evaporation method.

Figure 65:
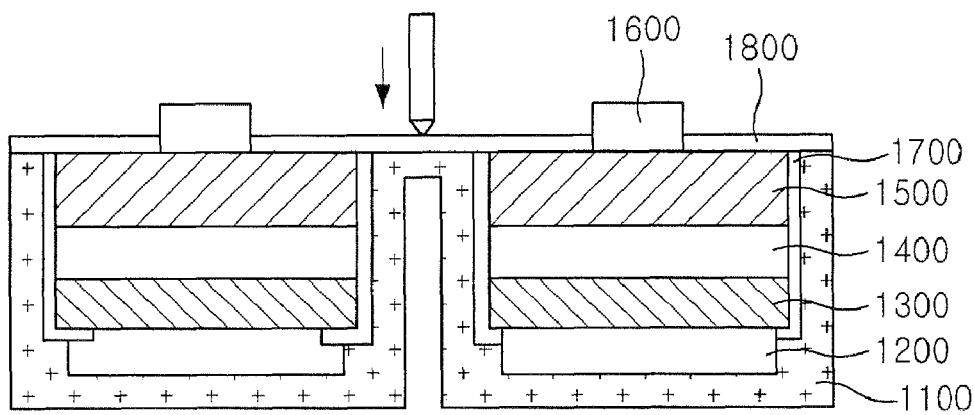

FIG. 65 is a sectional view illustrating a state after portions of the anti-reflective layer 1800 has been etched and an N-type ohmic electrode 1600 has been then formed. The N-type ohmic electrode is formed of Ti/Al or Cr/Au, or Ti/Al or Cr/Au on which Cr/Au or Ni/Au is deposited using an e-beam evaporator.

Figure 66:
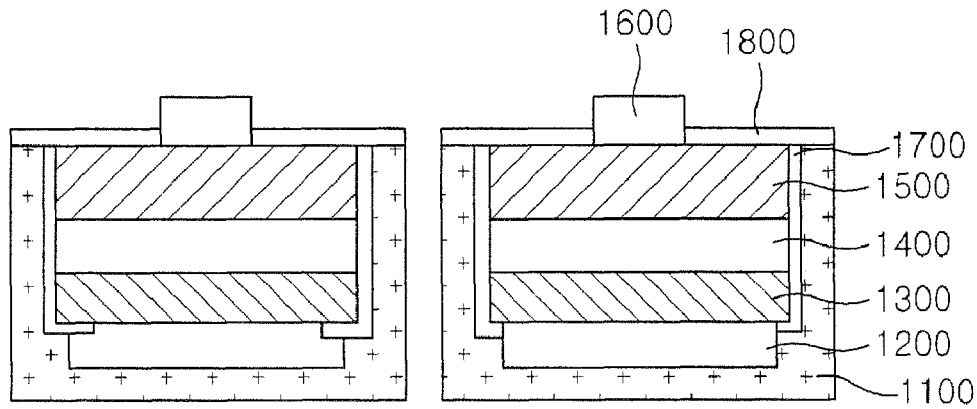

FIG. 66 is a sectional view showing a state after the chip has been separated. At this time, the chip is separated through a dicing or laser cutting technique.

Figure 67:
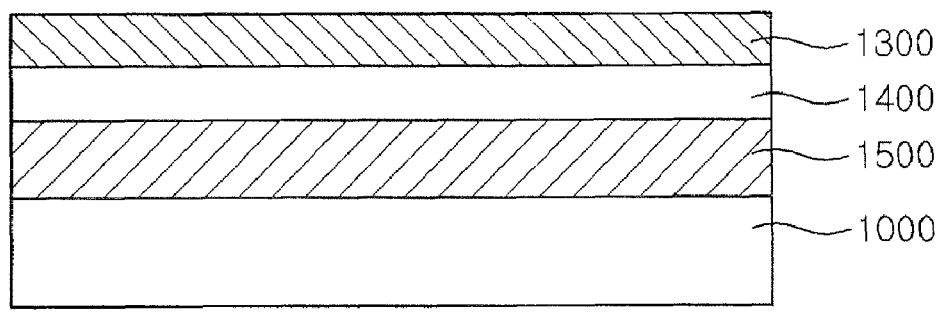
FIGS. 67 to 90 are a series of sectional views illustrating a process of manufacturing a vertical LED element according to a modified embodiment of the present invention.
Figure 68:
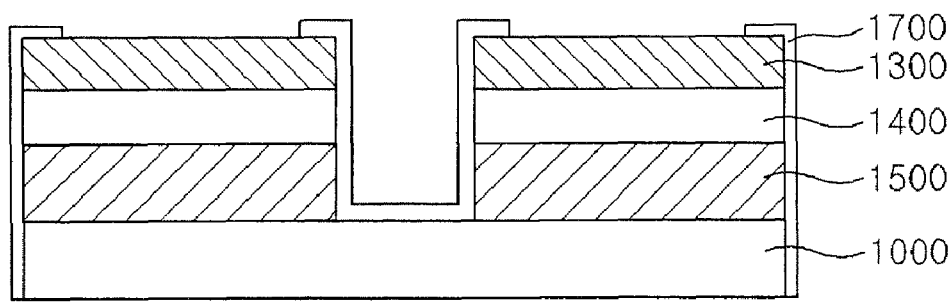
Figure 69:
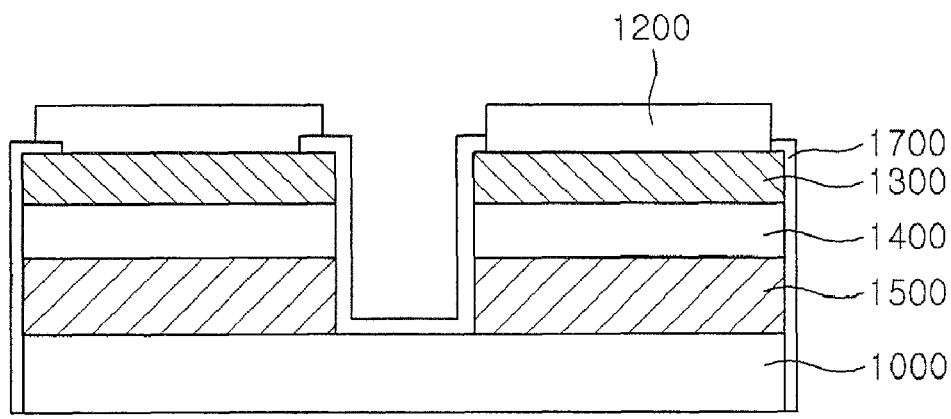

FIGS. 67 to 69 show a series of processes of manufacturing a vertical LED element according to a modified embodiment of the present invention.

The processes of FIGS. 67 to 69 are similar to those of FIGS. 59 to 61. That is, desired GaN layers, i.e. PN junction layers, are formed on the substrate 1000. Then, the element is isolated and the insulation film 1700 for protecting the isolated element is formed along the stepped portion. A part of the insulation film 1700 is patterned to expose a part of the P-type semiconductor layer 1300. The P-type electrode 1200 is formed on the exposed P-type semiconductor layer 1300.

Figure 70:
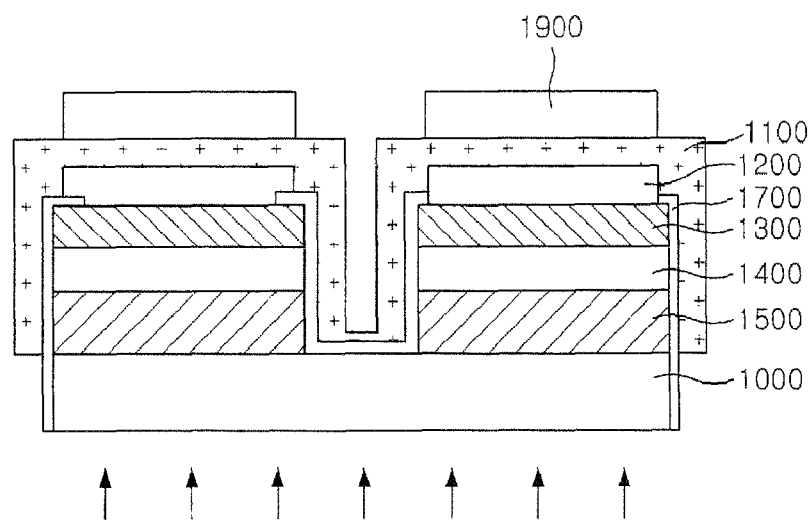
Figure 71:
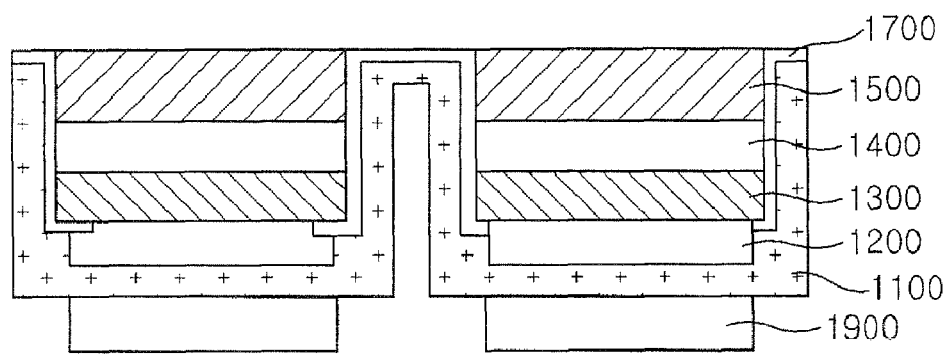
Figure 72:
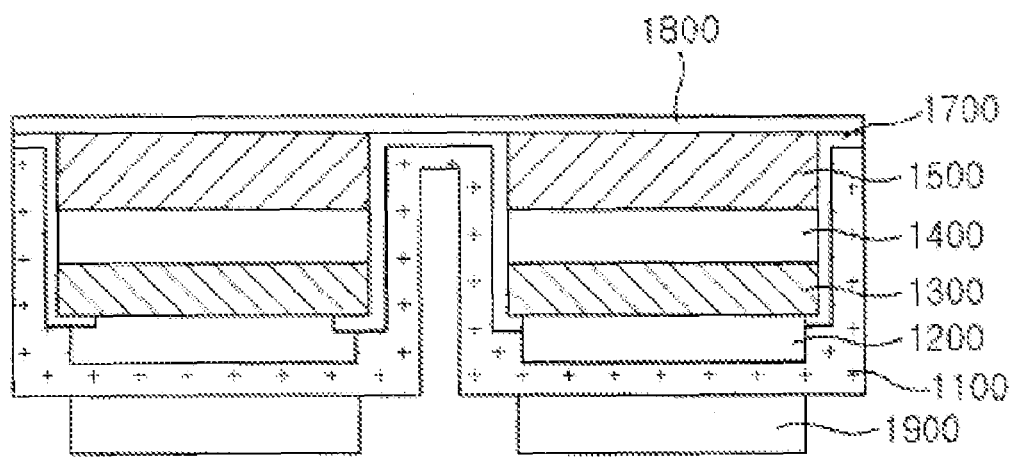
Figure 73:
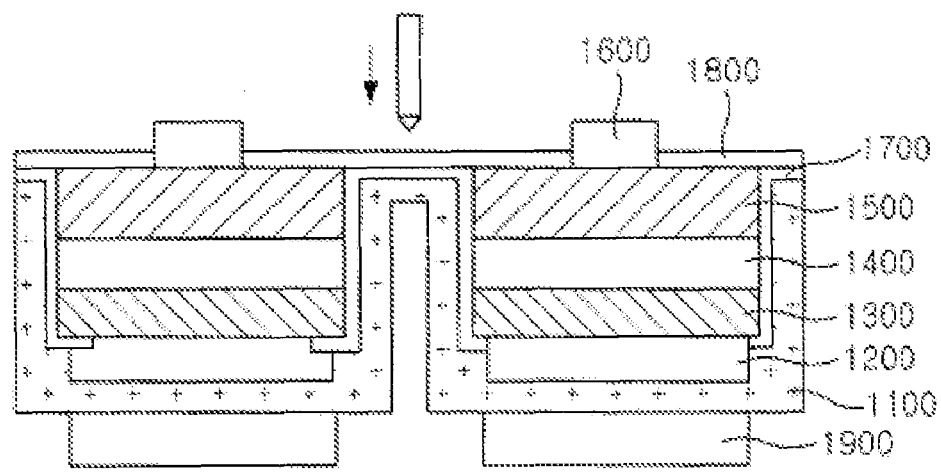
Figure 74:
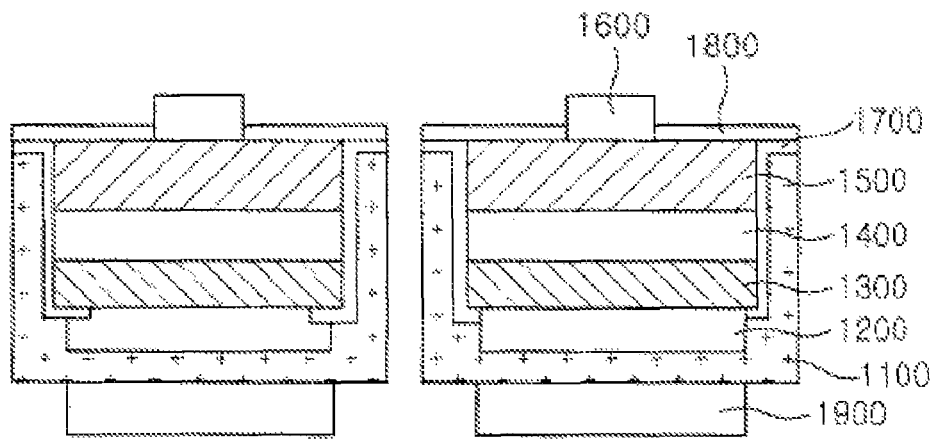

Next, as shown in FIG. 70, a metallic protective film layer 1100 is formed on the whole structure along the stepped portion, and a metallic support layer 1900 is then formed on the metallic protective film layer 1100 above the P-type semi-conductor layer 1300. That is, it is preferred that the metallic support layer 1900 with a thickness of 10~50 microns be formed on the metallic protective film layer 1100. As shown in FIGS. 71 to 74, the lower substrate 1000 is removed and the anti-reflective layer 1800 is then formed on the N-type semi-conductor layer 1500. Subsequently, a part of the anti-reflective layer 1800 is patterned to expose a part of the N-type semiconductor layer 1500 to the outside. The N-type electrode 1600 is formed on the exposed N-type semiconductor layer 1500. The chip is separated to complete a vertical LED structure.

Hereafter, a process of manufacturing a vertical LED element according to the modified embodiment of the present invention will be explained with reference to FIGS. 75 to 82 which is a series of sectional views illustrating a method of manufacturing the vertical LED of FIGS. 56 to 57.

Figure 75:
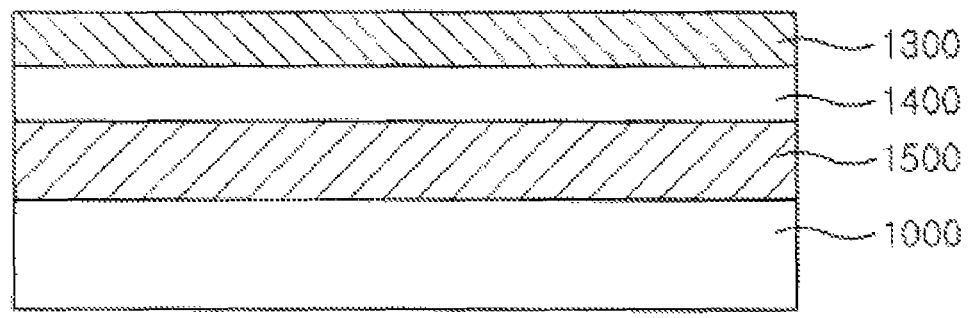
Figure 76:
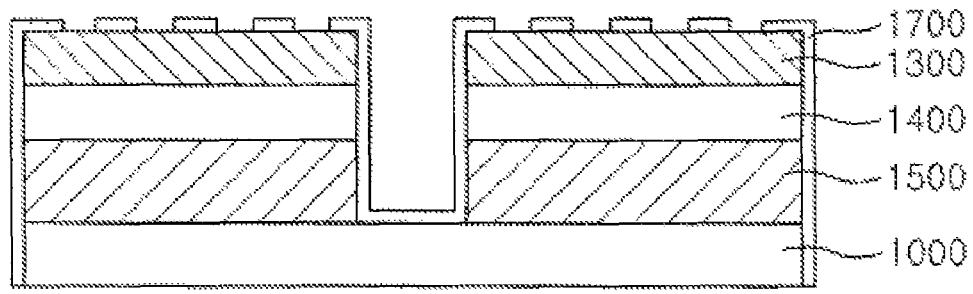

As shown in FIGS. 75 to 76, a plurality of PN-junction semiconductor layers are formed on the substrate 1000. The $SiO_2$-based insulation film 1700 is formed at a thickness of 0.05~5.0 microns using the PECVD method. Then, a micro pattern in the form of mesh is formed using a photoresist film. Using the photoresist film as a mask, the $SiO_2$ film is dry-etched using the BOE or $CF_4$ gas such that the P-type semiconductor layer 1300 can be exposed in a mesh form.

Figure 77:
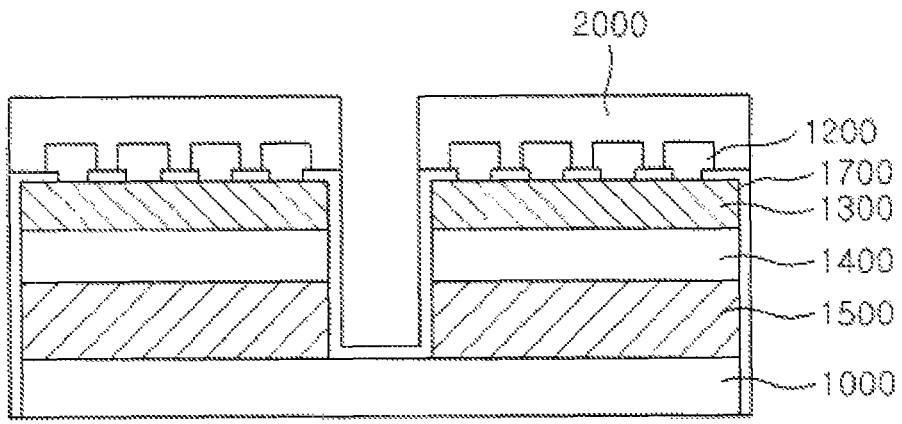

As shown in FIG. 77, the P-type reflective ohmic electrode layer 1200 is deposited on the exposed P-type semiconductor layer 1300 that has been exposed by etching the insulation film 1700. The reflective layer 2000 is formed on the P-type semiconductor layer 1300 on which the P-type electrode 1200 is formed. The P-type ohmic electrode 1200 is formed by depositing and heat treating an ohmic metal. Typically, Ni and Au are deposited at a thickness of several tens to several hundreds of nanometers using an e-beam evaporator. However, since reflectivity is important in case of the vertical LED according to this modified embodiment, metals including Ni/Ag, Pt/Ag, Ru/Ag, Ir/Ag or the like are used. Then, the rapid thermal annealing is performed for several seconds to several minutes at a temperature of 300 to 600° C. to form the electrode. Thereafter, Ag or Al-based reflective film is deposited on the P-type reflective ohmic electrode in a mesh form. The processes of FIGS. 78 to 82 are the same as those of FIGS. 59 to 74, and thus, detailed descriptions thereof will be omitted herein.

Next, a process of manufacturing a vertical LED element of this modified embodiment will be explained with reference to FIGS. 83 to 90. Here, FIGS. 83 to 90 are sectional views illustrating processing steps of manufacturing the vertical LED shown in FIG. 64.

Figure 78:
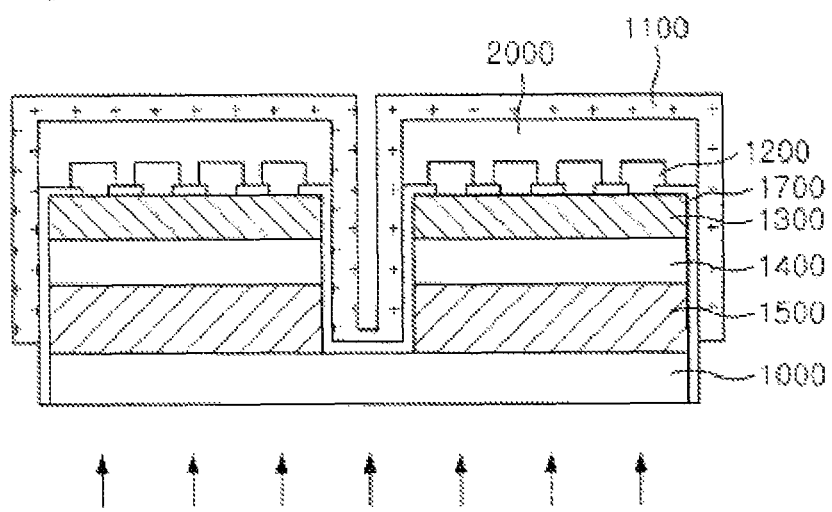
Figure 79:
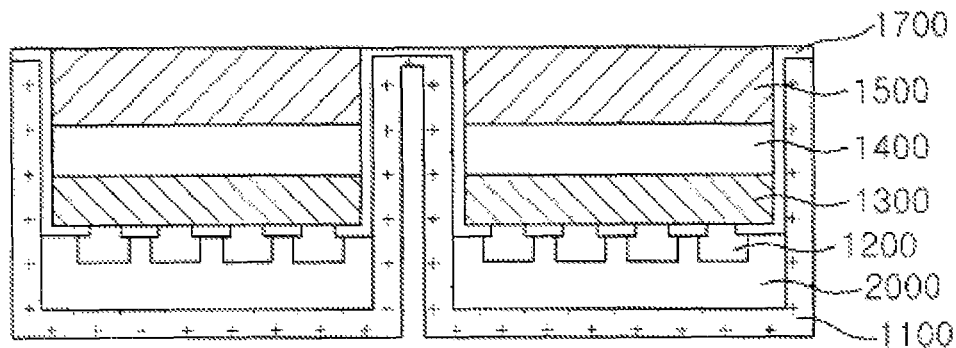
Figure 80:
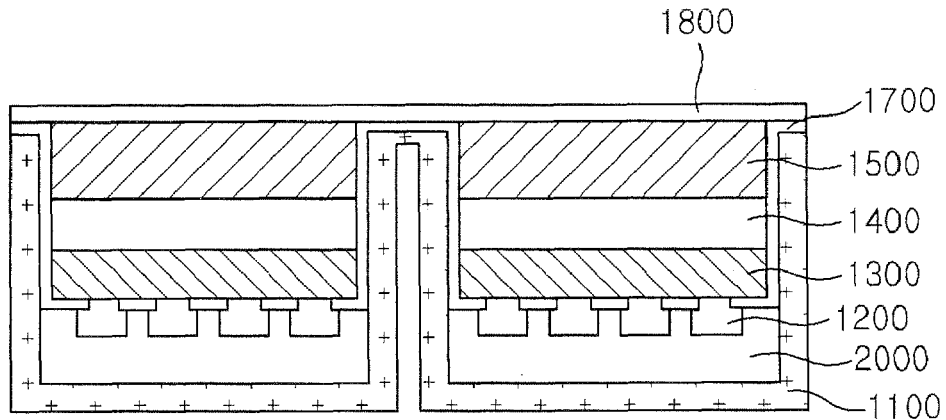
Figure 81:
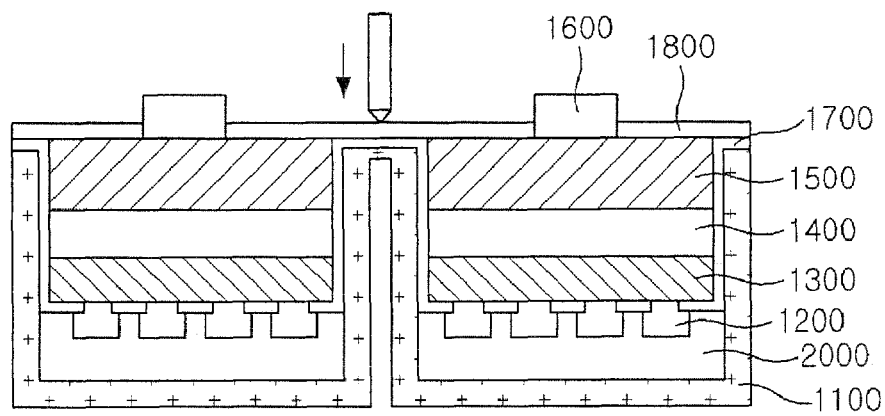
Figure 82:
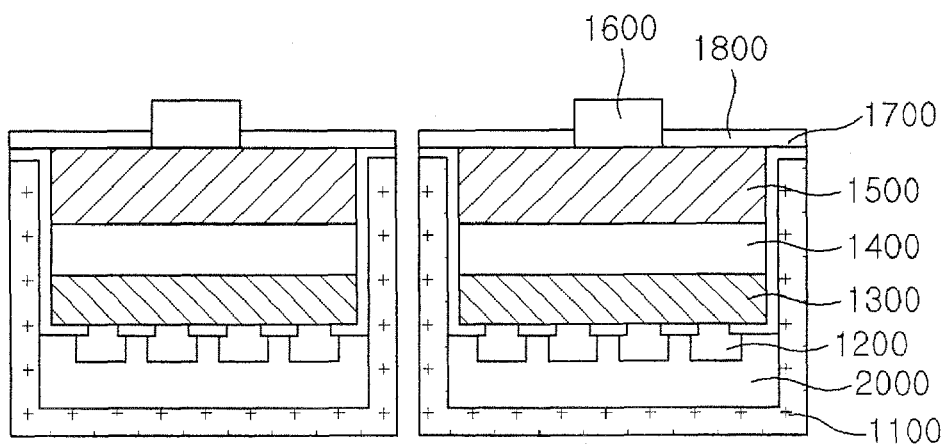
Figure 83:
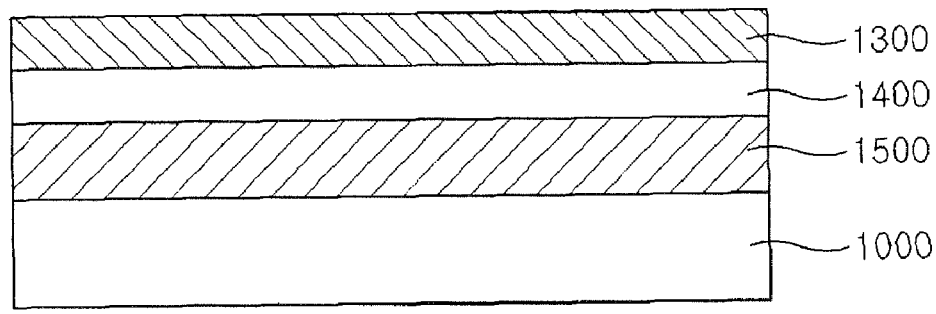
Figure 84:
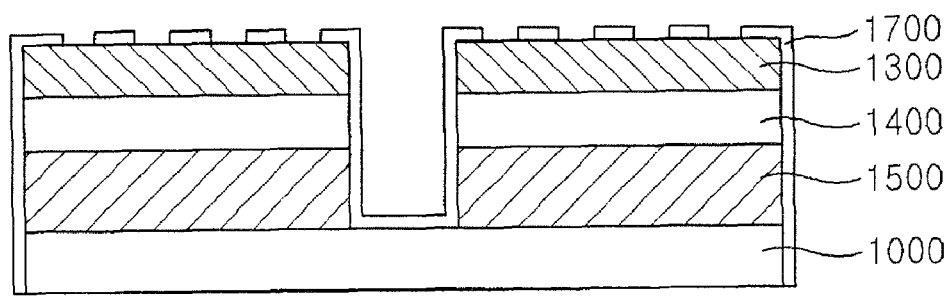
Figure 85:
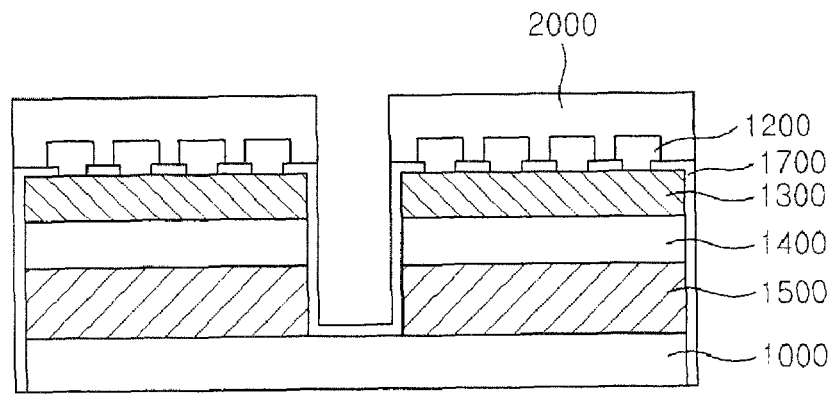
Figure 86:
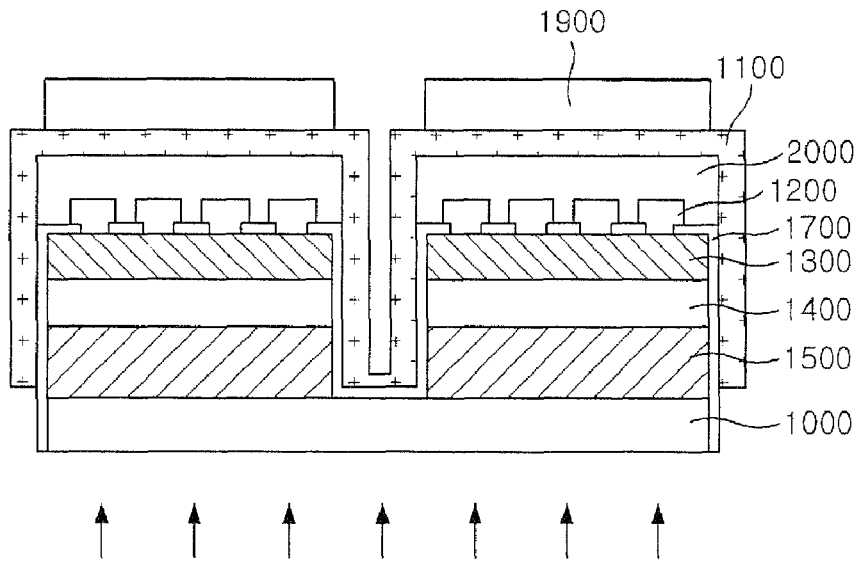
Figure 87:
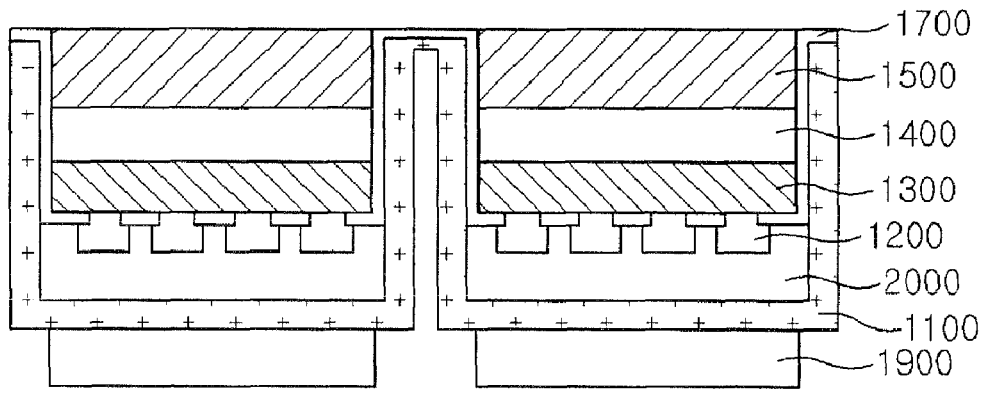
Figure 88:
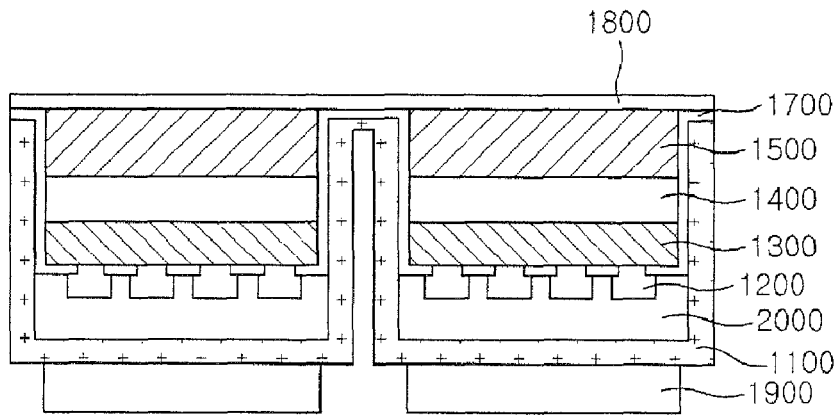
Figure 89:
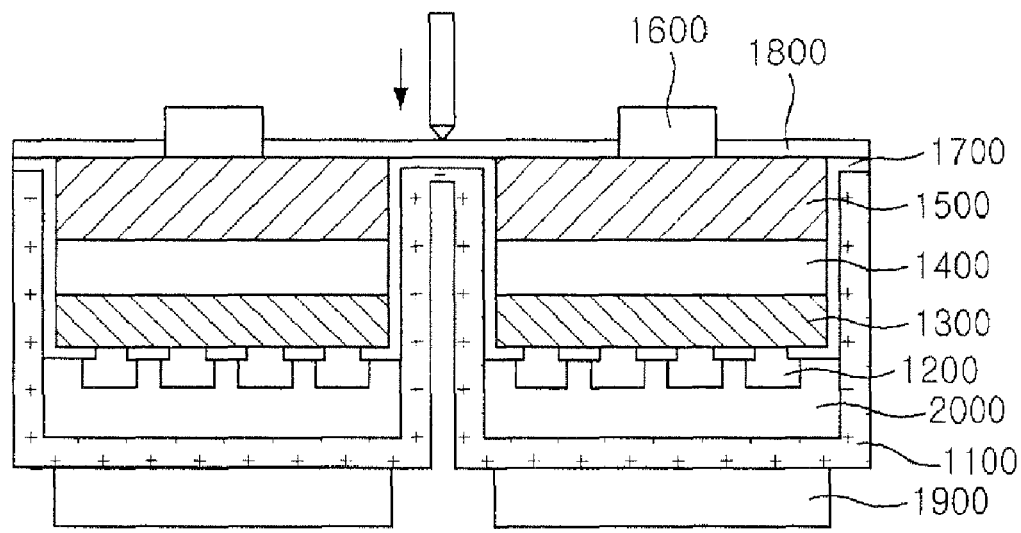
Figure 90:
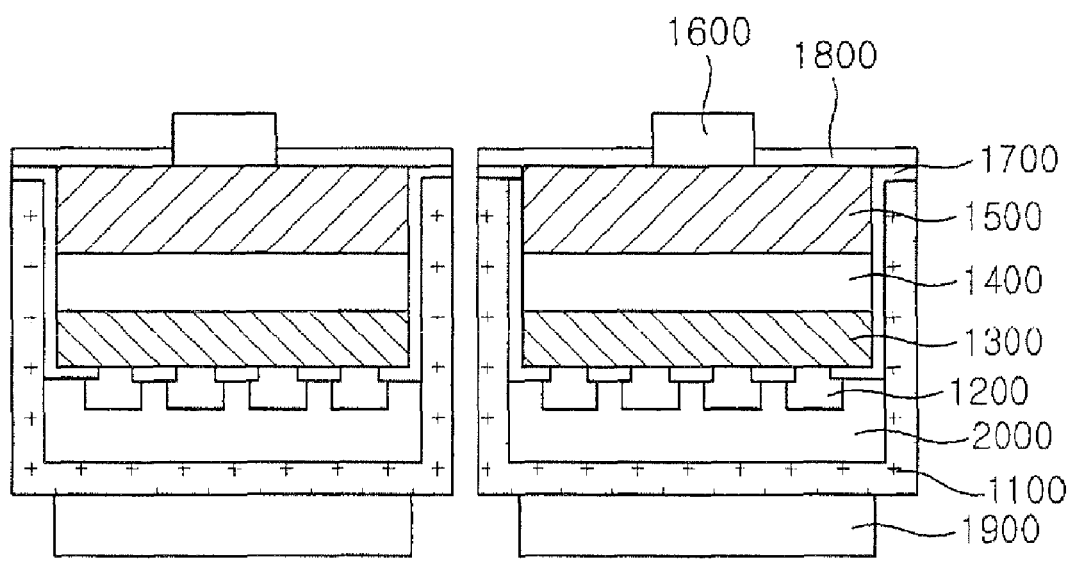

The processes of FIGS. 83 to 85 are the same as those of FIGS. 75 to 77. Referring to FIG. 86, a metallic protective film layer 1100 is formed along the stepped portion of the whole structure as shown in FIG. 78, and a metallic support layer 1900 is then formed on the metallic protective film layer 1100. As shown in the figure, since the metallic support layer 1900 is not formed in a trench area, a subsequent process of separating the elements can be easily performed. The processes of FIGS. 87 to 90 are the same as those illustrated in FIGS. 59 to 82, and thus, detailed descriptions thereof will be omitted herein.

In the previous embodiments, the metallic protective film layer 1100 is formed in such a way to wrap around the lateral sides and the bottom side of the element. Further, the metallic support layer 1900 is formed beneath the metallic protective film layer 1100. Thus, damages due to distortion or impact produced when separating the chip can be minimized.

Furthermore, the aforementioned insulation film 1700 employs an oxide thin film, which is formed of at least one of $SiO_2$, $Si_3N_4$, MgO, $Al_2O_3$, $TiO_2$, $VO_2$, $ZrO_2$, $Ce_2O_3$, $HfO_2$, $NbO_2$, $Ta_2O_5$, $Y_2O_3$, $V_2O_3$ and $WO_3$. At this time, the oxide film has a thickness of 100 nm to 100 microns. In addition, one or more thin film semiconductors such as GaN, AlGaN, AIN, SiC and diamond having a wide bandgap are alternately laminated to form an insulation film. Such an insulation film has a thickness of 100 nm to 100 microns.

The metallic protective film layer 1100 and the metallic support layer 1900 are formed of at least one of Au, Ni, W, Mo, Cu, Al, Ta, Ag, Pt and Cr. The metallic support layer 1900 has a thickness of 0.5~200 nm. In addition, the metallic protective film layer 1100 and the metallic support layer 1900 can be formed by performing the vacuum deposition using a conductive ceramic film such as $SrTiO_3$ doped with Nb, ZnO doped with Al, ITO and IZO or a semiconductor doped with impurities such as B-doped Si, As-doped Si and diamond doped with impurities.

The P-type electrode 1200 is formed of at least one of Ni, Pt, Ru, Ir, Rh, Ta, Mo, Ti, Ag, W, Cu, Cr, Pd, V, Co, Nb, Zr and Al and has a thickness of 5~2000 nm. In a case where the P-type electrode 1200 is formed in a double-layered form, its first layer is formed of at least one of Ni, Pt, Ru, Ir, Rh, Ta, Mo, Ti, Ag, W, Cu, Cr, Pd, V, Co, Nb, In and Zr while its second layer is formed of Ag and/or Al. At this time, the first layer has a thickness of 5~1000 nm, and the second layer has a thickness of 10~1000 nm. The P-type electrode 1200 may be formed in a multi-layered form having two or more layers. The aforementioned P-type electrode 1200 is heat treated for 30 seconds to 30 minutes at a temperature of 300~600° C. under a nitrogen, oxygen or air atmosphere. In addition, before forming the P-type electrode 1200, a reflective layer 2000 is formed on the P-type semiconductor layers 1300 and portions where the P-type electrode 1200 will be formed are then partially etched.

Further, the reflective layer 2000 is formed of Ag and/or Al. Alternatively, the reflective layer may be formed of an alloy containing Ag and less than 10% of other metals or an alloy containing Al and less than 10% of other metals.

Furthermore, the anti-reflective layer 1800 is formed of at least one of ITO, ZnO, $SiO_2$, $Si_3N_4$ and IZO and has a thickness of 10~5000 nm.

INDUSTRIAL APPLICABILITY

As described above, since a double-layered metallic support layer is used as a metallic support layer at the bottom thereof in the vertical GaN LED of the present invention, the chip can be easily separated.

Further, since a thick metallic protective film layer with a thickness of at least 10 microns is formed on the lateral and bottom sides of the element, the element can be protected against external impact.

Furthermore, since a P-type reflective electrode is partially formed on a p-GaN layer in a mesh form and a reflective layer is inserted therebetween, photons generated in an active layer can be maximally emitted toward an n-GaN layer.

In addition, since a metallic substrate, conductive layer substrate or conductive ceramic substrate is used instead of a sapphire substrate to efficiently release the generated heat to the outside when the element is operated, it is suitable for a high-power application. Moreover, since photons generated in an InGaN layer are emitted through an n-GaN layer, a path where the photons are emitted is short. Therefore, the number of photons absorbed during their emission can be reduced. Furthermore, since a high concentration of doping ($>10^{19}/cm^3$) into an n-GaN layer can be obtained, electrical conductivity and thus current diffusion resistance can be improved. Therefore, optical output characteristics can be enhanced.

Also, the present invention provides a technique for separating a GaN thin film layer of the LED structure from the sapphire substrate using a laser and a process of manufacturing a vertical GaN LED on the separated thin film layer.

From the foregoing, it will be understood by those skilled in the art that various changes and modifications can be made within the technical spirit and scope of the present invention. Therefore, the spirit and scope of the present invention is not limited to the contents described in the preferred embodiment but to the appended claims.

What is claimed is:

1. A light emitting element, comprising:
   a P-type semiconductor layer;
   an active layer and an N-type semiconductor layer formed on the P-type semiconductor layer;
   an N-type electrode formed on the N-type semiconductor layer;
   an insulation film formed on at least a lateral side of the N-type semiconductor layer; and
   a metallic protective layer for protecting the P-type semiconductor layer and N-type semiconductor layer.

2. The light emitting element as claimed in claim 1, wherein the metallic protective layer is formed on lateral sides of the P-type and N-type semiconductor layers and on a bottom side of the P-type semiconductor layer.

3. The light emitting element as claimed in claim 1, further comprising an insulation layer formed on a part of a bottom side of the P-type semiconductor layer.

4. The light emitting element as claimed in claim 3, wherein the insulation layer extends to a lateral side of the active layer.

5. The light emitting element as claimed in claim 1, further comprising an anti-reflective layer formed on the N-type semiconductor layer.

6. The light emitting element as claimed in claim 1, further comprising a P-type electrode formed beneath the P-type semiconductor layer.

7. The light emitting element as claimed in claim 6, wherein the P-type electrode includes a contact metallic layer, a reflective metallic layer, a diffusion barrier layer and a bonding metallic layer.

* * * * *